(12) United States Patent
Lee et al.

(10) Patent No.: US 6,624,069 B2
(45) Date of Patent: *Sep. 23, 2003

(54) METHODS OF FORMING INTEGRATED CIRCUIT CAPACITORS HAVING DOPED HSG ELECTRODES

(75) Inventors: Seung-Hwan Lee, Seoul (KR); Sang-Hyeop Lee, Seoul (KR); Young-Sun Kim, Seoul (KR); Se-Jin Shim, Seoul (KR); You-Chan Jin, Kyunggi-Do (KR); Ju-Tae Moon, Kyunggi-Do (KR); Jin-Seok Choi, Kyunggi-Do (KR); Young-Min Kim, Kyunggi-Do (KR); Kyung-Hoon Kim, Seoul (KR); Kab-Jin Nam, Kyunggi-Do (KR); Young-Wook Park, Kyunggi-Do (KR); Seok-Jun Won, Seoul (KR); Young-Dae Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 15 days.

This patent is subject to a terminal disclaimer.

(21) Appl. No.: 09/735,244

(22) Filed: Dec. 12, 2000

(65) Prior Publication Data

US 2001/0001501 A1 May 24, 2001

Related U.S. Application Data

(63) Continuation of application No. 09/036,356, filed on Mar. 6, 1998, now Pat. No. 6,218,260.

(30) Foreign Application Priority Data

Sep. 26, 1997 (KR) ............................................. 97-48930
Apr. 22, 1997 (KR) ............................................. 97-14833
Apr. 30, 1997 (KR) ............................................. 97-16812
Jul. 28, 1997 (KR) ............................................. 97-35460
Jun. 5, 1997 (KR) ............................................. 97-23381

(51) Int. Cl.[7] ............................................. H01L 21/44

(52) U.S. Cl. ..................... 438/665; 438/240; 438/266; 438/398; 438/964

(58) Field of Search ........................ 438/665, 964, 438/266, 398, 240, 465, 265

(56) References Cited

U.S. PATENT DOCUMENTS

| | | | | |
|---|---|---|---|---|
| 4,411,708 A | * | 10/1983 | Winham | 148/1.5 |
| 4,636,833 A | | 1/1987 | Nishioka et al. | 357/71 |
| 5,102,820 A | | 4/1992 | Chiba | 437/52 |
| 5,142,438 A | | 8/1992 | Reinberg | 361/313 |
| 5,208,479 A | | 5/1993 | Mathews et al. | 257/534 |
| 5,227,651 A | | 7/1993 | Kim et al. | 257/309 |
| 5,234,857 A | | 8/1993 | Kim et al. | 437/47 |
| 5,278,091 A | | 1/1994 | Fazan et al. | 437/52 |
| 5,330,614 A | | 7/1994 | Ahn | 156/631 |
| 5,352,623 A | * | 10/1994 | Kamiyama | 438/396 |
| 5,358,888 A | | 10/1994 | Ahn et al. | 437/52 |
| 5,362,632 A | | 11/1994 | Mathews | 437/47 |
| 5,385,863 A | | 1/1995 | Tatsumi et al. | 437/109 |
| 5,407,534 A | | 4/1995 | Thakur | 156/662 |
| 5,447,878 A | | 9/1995 | Park et al. | 437/52 |
| 5,447,881 A | | 9/1995 | Ryou | 437/60 |
| 5,452,178 A | | 9/1995 | Emesh et al. | 361/303 |
| 5,459,345 A | | 10/1995 | Okudaira et al. | 257/310 |
| 5,486,488 A | * | 1/1996 | Kamiyama | 438/396 |
| 5,492,850 A | | 2/1996 | Ryou | 437/52 |
| 5,554,557 A | | 9/1996 | Koh | 437/52 |
| 5,597,754 A | | 1/1997 | Lou et al. | 437/52 |
| 5,608,247 A | | 3/1997 | Brown | 257/306 |
| 5,612,558 A | | 3/1997 | Harshfield | 257/298 |
| 5,618,747 A | | 4/1997 | Lou | 438/398 |
| 5,622,889 A | | 4/1997 | Yoo et al. | 438/397 |
| 5,623,243 A | | 4/1997 | Watanabe et al. | 257/309 |
| 5,629,223 A | | 5/1997 | Thakur | 438/398 |
| 5,634,974 A | | 6/1997 | Weimer et al. | 117/103 |
| 5,639,685 A | | 6/1997 | Zahurak et al. | 437/60 |
| 5,656,531 A | | 8/1997 | Thakur et al. | 438/398 |
| 5,658,381 A | | 8/1997 | Thakur et al. | 257/309 |
| 5,663,085 A | * | 9/1997 | Tanigawa | 438/255 |
| 5,663,090 A | | 9/1997 | Dennison et al. | 438/398 |
| 5,691,228 A | | 11/1997 | Ping et al. | 437/60 |
| 5,696,014 A | | 12/1997 | Figura | 437/52 |
| 5,721,153 A | | 2/1998 | Kim et al. | 437/60 |
| 5,721,171 A | | 2/1998 | Ping et al. | 438/398 |
| 5,726,085 A | | 3/1998 | Crenshaw et al. | 438/255 |

| | | | |
|---|---|---|---|
| 5,741,734 A | 4/1998 | Lee | 438/235 |
| 5,753,559 A | 5/1998 | Yew et al. | 438/398 |
| 5,759,262 A | 6/1998 | Weimer et al. | 117/88 |
| 5,759,894 A | 6/1998 | Tseng et al. | 438/255 |
| 5,763,306 A | 6/1998 | Tsai | 438/255 |
| 5,798,280 A | 8/1998 | Mathews et al. | 437/165 |
| 5,804,480 A | 9/1998 | Lu et al. | 438/253 |
| 5,811,333 A | 9/1998 | Zenke | 438/255 |
| 5,817,555 A | 10/1998 | Cho | 438/253 |
| 5,821,152 A | 10/1998 | Han et al. | 438/398 |
| 5,837,581 A | 11/1998 | Cheng | 438/255 |
| 5,872,033 A | 2/1999 | Figura | 438/255 |
| 5,874,336 A | 2/1999 | Cherng | 438/255 |
| 5,885,867 A | 3/1999 | Shin et al. | 438/255 |
| 5,885,869 A | 3/1999 | Turner et al. | 438/261 |
| 5,891,744 A | 4/1999 | Lowrey et al. | 438/14 |
| 5,897,352 A | 4/1999 | Lin et al. | 438/255 |
| 5,899,725 A | 5/1999 | Harshfield | 438/398 |
| 5,989,973 A * | 11/1999 | Zahurak et al. | 438/398 |
| 6,218,260 B1 * | 4/2001 | Lee et al. | 438/398 |

FOREIGN PATENT DOCUMENTS

| JP | 8-298312 | 11/1996 | H01L/27/108 |
|---|---|---|---|

OTHER PUBLICATIONS

Watanabe et al., "A New Cylindrical Capacitor Using Hemispherical Grained Si (HSG–Si) for 256 Mb DRAMs," IEEE, 1992, pp. 10.1.1–10.1.4.

First Office Action in Chinese Patent Application No. 98106601.1; Jan. 17, 2003.

* cited by examiner

*Primary Examiner*—Olik Chaudhuri
*Assistant Examiner*—Khiem Nguyen

(74) *Attorney, Agent, or Firm*—Myers Bigel Sibley & Sajovec

(57) ABSTRACT

Methods of forming integrated circuit capacitors include the steps of forming a lower electrode of a capacitor by forming a conductive layer pattern (e.g., silicon layer) on a semiconductor substrate and then forming a hemispherical grain (HSG) silicon surface layer of first conductivity type on the conductive layer pattern. The inclusion of a HSG silicon surface layer on an outer surface of the conductive layer pattern increases the effective surface area of the lower electrode for a given lateral dimension. The HSG silicon surface layer is also preferably sufficiently doped with first conductivity type dopants (e.g., N-type) to minimize the size of any depletion layer which may be formed in the lower electrode when the capacitor is reverse biased and thereby improve the capacitor's characteristic Cmin/Cmax ratio. A diffusion barrier layer (e.g., silicon nitride) is also formed on the lower electrode and then a dielectric layer is formed on the diffusion barrier layer. The diffusion barrier layer is preferably made of a material of sufficient thickness to prevent reaction between the dielectric layer and the lower electrode and also prevent out-diffusion of dopants from the HSG silicon surface layer to the dielectric layer. The dielectric layer is also preferably formed of a material having high dielectric strength to increase capacitance.

46 Claims, 15 Drawing Sheets

METHODS OF FORMING INTEGRATED CIRCUIT CAPACITORS HAVING DOPED HSG ELECTRODES

CROSS-REFERENCE TO RELATED APPLICATION

This application is a continuation of U.S. application Ser. No. 09/036,356, filed Mar. 6, 1998, now U.S. Pat. No. 6,218,260, the disclosure of which is hereby incorporated herein by reference.

FIELD OF THE INVENTION

The present invention relates to methods of forming integrated circuits and circuits formed thereby, and more particularly to methods of forming integrated circuit capacitors and capacitors formed thereby.

BACKGROUND OF THE INVENTION

The demand for higher capacity semiconductor memory devices has resulted in improved techniques to form memory devices and structures therein at higher levels of integration. However, because higher levels of integration typically require memory devices having smaller unit cell size, the area occupied by a cell capacitor in a memory device, such as a DRAM device, may have to be reduced significantly. As will be understood by those skilled in the art, this reduction in cell capacitor area can degrade memory cell performance at low voltages and adversely impact soft-error rate (SER) caused by α-particle radiation.

Conventional methods of increasing cell capacitor area include forming cell capacitor electrodes (e.g., storage electrodes) with hemispherical grain (HSG) silicon surface layers. For example, a conventional method of forming HSG silicon surface layers on cell capacitor electrodes is disclosed in U.S. Pat. No. 5,407,534 to Thakur. However, while capacitors having HSG surface layers therein (hereinafter "HSG capacitors") have manifested enhanced capacitance in high density integrated circuits, HSG capacitors may lack stability and may incur performance degradation over the lifetime of an integrated circuit memory device. Studies have shown that the capacitance of a conventional HSG capacitor can vary greatly with respect to the polarity of a voltage applied across the capacitor's electrodes. In particular, when the voltage between the upper and lower electrodes of a HSG capacitor switches polarity from a positive value to a negative value and becomes reverse biased (during such operations as reading and writing operations), a significant drop in capacitance may be observed. For example, FIG. 2 illustrates a capacitance response curve of a conventional HSG capacitor when a voltage is applied across its upper and lower electrodes. As shown, the maximum capacitance (Cmax) is obtained when the potential difference across the electrodes is positive. Yet, when the potential difference is driven to a negative value, the capacitance gradually drops. In fact, at a negative value of −1.5V, the capacitance is at a minimum (Cmin), reaching only about 55% of Cmax.

SUMMARY OF THE INVENTION

It is therefore an object of the present invention to provide improved methods of forming integrated circuit capacitors and capacitors formed thereby.

It is still another object of the present invention to provide integrated circuit capacitors having electrodes with increased surface area, and capacitors formed thereby.

It is yet another object of the present invention to provide methods of forming integrated circuit capacitors having uniform capacitance characteristics when reversed and forward biased, and capacitors formed thereby.

It is still another object of the present invention to provide methods of forming integrated circuits having capacitors therein with improved long-term reliability, and capacitors formed thereby.

These and other objects, advantages and features of the present invention are provided by methods which include the steps of forming a lower electrode of a capacitor by forming a conductive layer pattern (e.g., silicon layer) on a semiconductor substrate and then forming a hemispherical grain (HSG) silicon surface layer of first conductivity type on the conductive layer pattern. The inclusion of a HSG silicon surface layer on an outer surface of the conductive layer pattern increases the effective surface area of the lower electrode for a given lateral dimension. The HSG silicon surface layer is also preferably sufficiently doped with first conductivity type dopants (e.g., N-type) to minimize the size of any depletion layer which may be formed in the lower electrode when the capacitor is reverse biased and thereby improve the capacitor's characteristic Cmin/Cmax ratio. A diffusion barrier layer (e.g., silicon nitride) is also formed on the lower electrode and then a dielectric layer is formed on the diffusion barrier layer. The diffusion barrier layer is preferably made of a material of sufficient thickness to prevent reaction between the dielectric layer and the lower electrode and also prevent out-diffusion of dopants from the HSG silicon surface layer to the dielectric layer. The dielectric layer is also preferably formed of a material having high dielectric strength to increase capacitance.

According to a preferred aspect of the present invention, the step of forming a HSG silicon surface layer comprises seeding an upper surface of the conductive layer pattern with silicon seed crystals and then growing the seed crystals as single crystal grains. Steps are also performed to anneal the conductive layer pattern and then dope the HSG silicon surface layer with N-type dopants provided by a phosphine gas source. This doping step may be performed in a rapid thermal processing (RTP) apparatus and is preferably performed so that the HSG silicon surface layer has an N-type conductivity which exceeds the N-type of a portion of the conductive layer pattern extending adjacent the semiconductor substrate. This higher conductivity inhibits the formation of a depletion layer in the lower electrode when the capacitor is reverse biased. The diffusion barrier layer may also be doped in-situ with first conductivity type dopants to further prevent any reduction in the conductivity of the HSG silicon surface layer caused by out-diffusion of dopants to the dielectric layer. In addition, the diffusion barrier layer may be formed as a composite of a first silicon nitride layer formed by rapid thermal nitridation (RTN) and a second silicon nitride layer formed by chemical vapor deposition (CVD). The dielectric layer may also be formed of a high dielectric material such as tantalum oxide. In particular, the dielectric layer is preferably formed by forming multiple thin layers of tantalum oxide and then densifying each of the layers individually to improve the characteristics of the dielectric layer and underlying silicon nitride diffusion barrier layer.

DESCRIPTION OF PREFERRED EMBODIMENTS

Figure 1A:
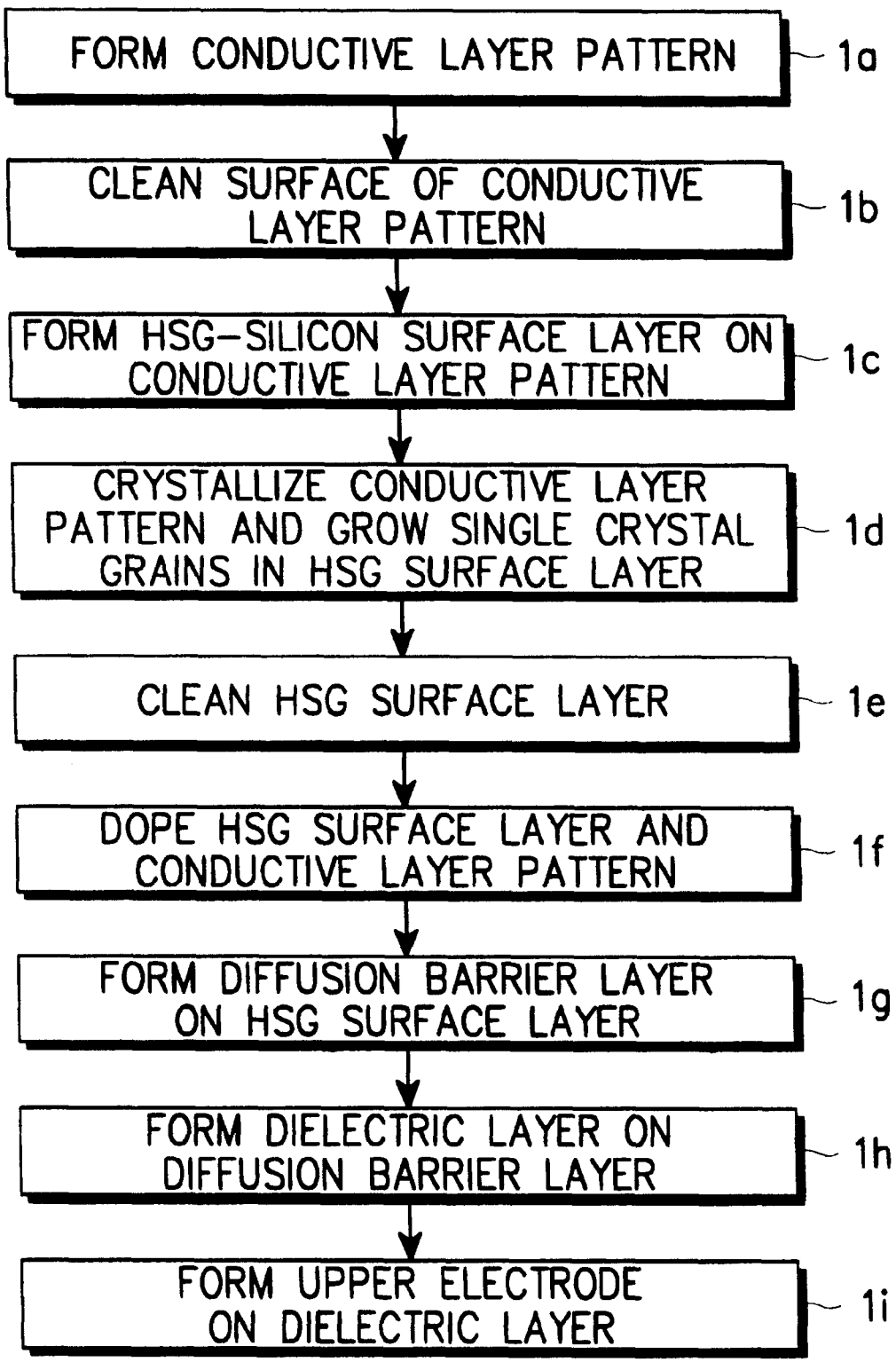
FIG. 1A is a flow chart of steps which illustrate methods of forming capacitors according to a preferred embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 1B:
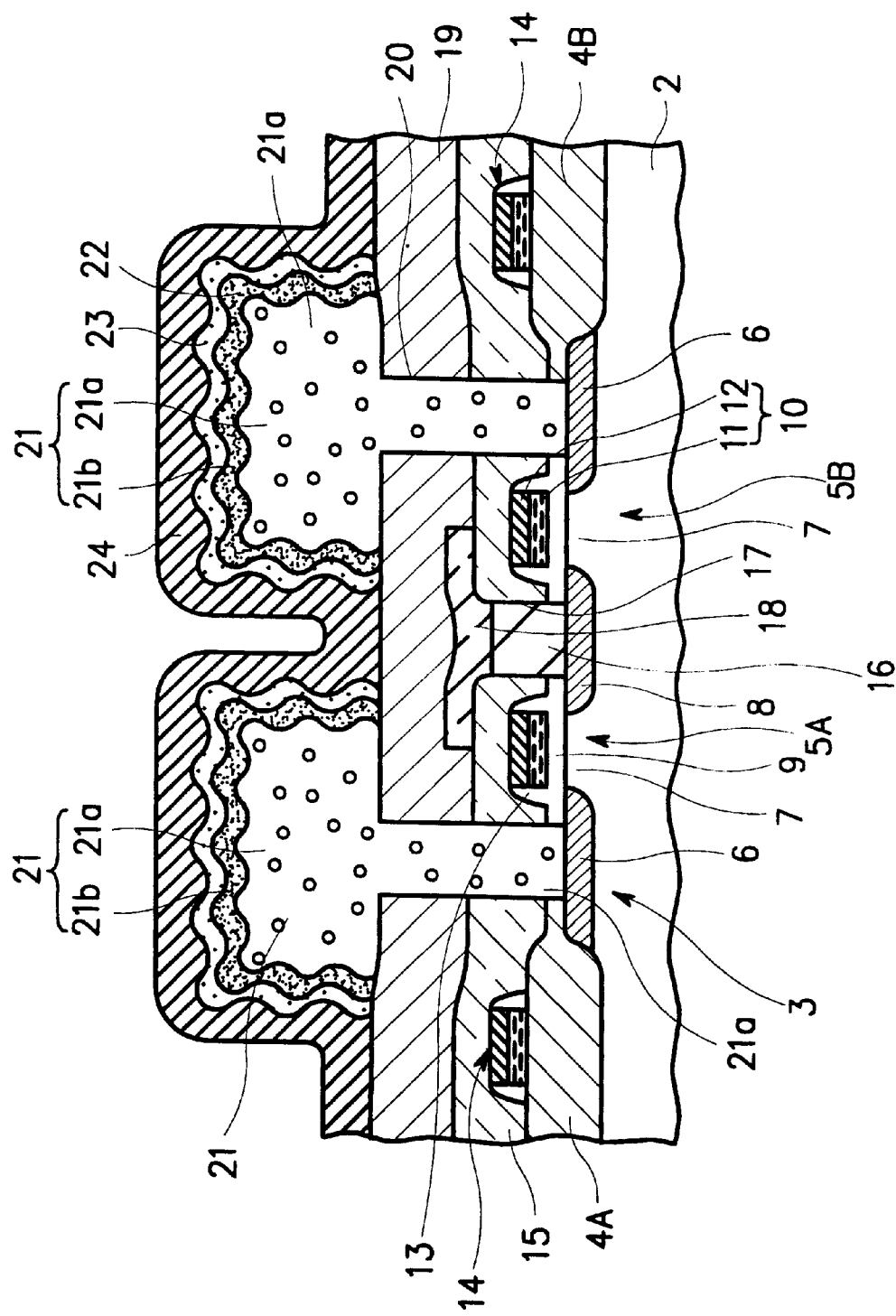
FIG. 1B is a cross-sectional illustration of an integrated circuit memory device having hemispherical grain (HSG) capacitors therein formed in accordance with the methods illustrated by FIG. 1A.
Figure 2:
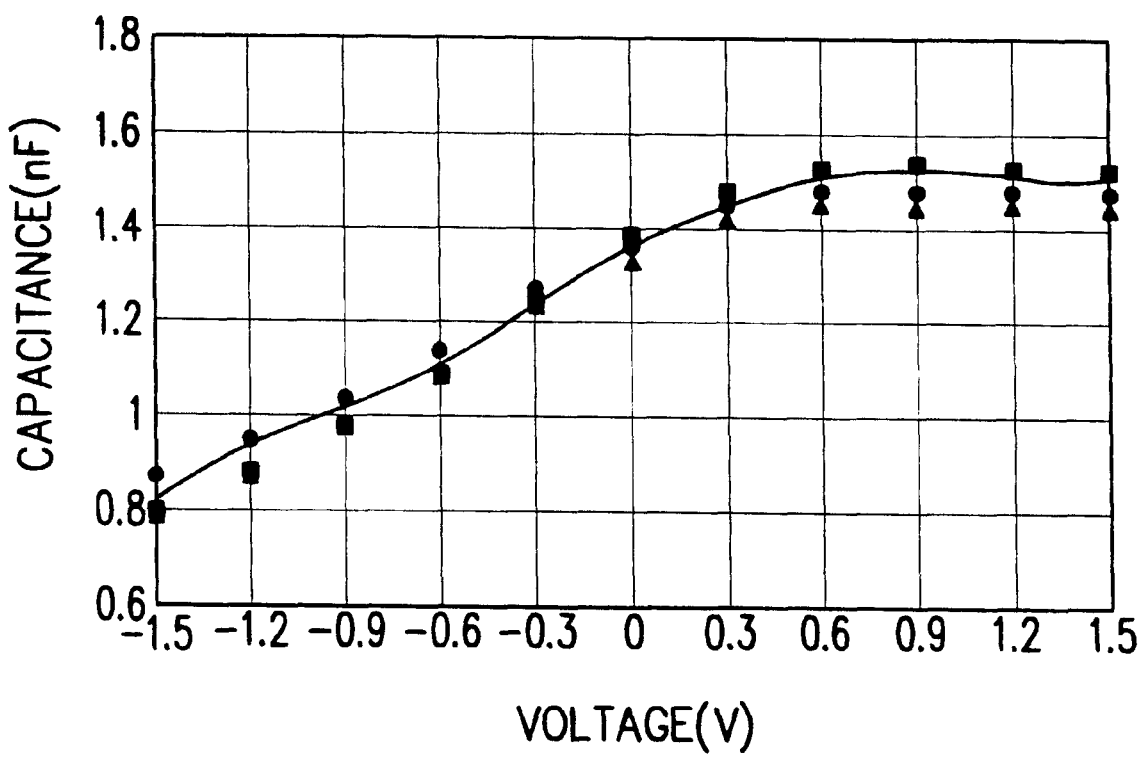
FIG. 2 is a graphical illustration of a capacitance response curve of a conventional HSG capacitor.

Referring now to FIGS. 1A and 1B, methods of forming capacitors in accordance with a preferred embodiment of the present invention and memory devices embodying capacitors formed thereby, will be described. In particular, a cross-sectional illustration of an integrated circuit memory device containing memory cells therein with HSG capacitors formed in accordance with the methods of FIG. 1A, is best illustrated by FIG. 1B. The integrated circuit memory device comprises a semiconductor substrate 2 of second conductivity type (e.g., P-type) having field oxide isolation layers 4A and 4B therein which define an active region 3 in which a pair of access transistors 5A and 5B are formed. Each of the transistors 5A and 5B contains a source region 6 of first conductivity type (e.g., N-type) in the active region 3. A first conductivity type common drain region 8 is also formed in the active region 3. The common drain region 8 is spaced from the source regions 6 by respective channel regions 7 which extend opposite the gate electrodes of the access transistors 5A and 5B. Gate oxide layers 9 of the access transistors 5A and 5B are also formed on the respective channel regions 7. Insulated gate electrodes 10 are also provided for controlling the conductivity of the channel regions 7 is response to respective word line signals. Each of the gate electrodes 10 is preferably a composite of a polysilicon layer 11 and a respective refractory metal silicide layer 12. Sidewall insulating layers 13 are also formed on opposing sidewalls of each gate electrode 10. Polycide layers 14 which may be patterned as word lines, are also preferably provided on the field oxide isolations regions 4A and 4B. As illustrated, a first interlayer insulating layer 15 is provided as a first passivation layer. A via hole 17 is also formed in the first interlayer insulating layer 15 to expose a portion of the surface of the common drain region 8. A conductive plug 16 made of doped polysilicon (or tungsten) is provided in the via hole 17, in ohmic contact with the common drain region 8. The conductive plug 16 is also in contact with a bit line 18 which may be made of doped polysilicon, a refractory metal, polycide or silicide, for example. A second interlayer insulating layer 19 is provided as a second passivation layer. The second interlayer insulating layer 19 covers the bit line 18 and the first interlayer insulating layer 15. Additional via holes 20 (each of which exposes a portion of the surface of a respective source region 6) are also provided. These holes extend through the first and second interlayer insulating layers 15 and 19, as illustrated.

Each of the illustrated memory cells also comprises a storage capacitor having a lower electrode electrically coupled to a respective source region 6. As described more fully hereinbelow, the lower electrode 21 of each storage capacitor includes a composite of a polysilicon layer 21a of first conductivity type and a hemispherical grain (HSG) silicon surface layer which has a "rugged" surface. A diffusion barrier layer 22 is also formed on each lower electrode 21, to prevent out-diffusion of dopant impurities from the lower electrode 21 to an upper dielectric layer 23. The barrier layer 22 also inhibits chemical reaction between the lower electrode 21 (including the HSG surface layer 21b) and the dielectric layer 23 (e.g., a $Ta_2O_5$ layer). To complete the storage capacitor, a conductive upper electrode layer 24 is formed on the dielectric layer 23.

Referring now to FIG. 1A, preferred methods of forming HSG capacitors include the step of forming a conductive layer pattern 21a on a semiconductor substrate 2, Block 1a. The conductive layer pattern 21a may initially comprise a single amorphous silicon (a-Si) layer or a composite of a polycrystalline silicon layer (in contact with the semiconductor substrate 2) and an amorphous silicon layer on the polycrystalline silicon layer. During formation, the conductive layer pattern 21a is preferably doped in-situ with a first conductivity type impurity (e.g. N-type), however, steps may also be performed to dope the conductive layer pattern 21a after it has been formed. This first conductivity type dopant impurity may be phosphorus (P) or similar N-type dopant. According to a preferred aspect of the present invention, the conductive layer pattern 21a is doped to have a first conductivity type impurity concentration therein which is no greater than about $1.0 \times 10^{20}$ dopant impurities/$cm^3$. A step may also be performed to fully activate the dopant impurities. As will be understood by those skilled in the art, the magnitude of the dopant impurity concentration in the conductive layer pattern 21a is inversely proportional to the sheet resistance of the conductive layer pattern 21a. For the present invention, an impurity concentration of about $3.7 \times 10^{19}$ impurities/cm$^3$ in the conductive layer pattern 21a is appropriate for a conductive layer pattern 21a having a thickness of about 8,000 Å and a sheet resistance of about 36 Ω/cm$^2$.

Referring now to Block 1b in FIG. 1A, after the conductive layer pattern 21a has been formed, a cleaning step is performed to remove contaminants, if any, from the exposed surfaces of the conductive layer pattern 21a. In particular, the cleaning step may be performed to remove any native oxide film (not shown) which may have formed on the exposed surfaces. The cleaning step may include exposing the conductive layer pattern 21a to a wet cleaning agent such as a hydrofluoric acid (HF) solution or buffered oxide etchant (BOE). Although less preferred, this cleaning step may be omitted. As illustrated best by Block 1c, a step is then performed to increase the exposed surface area of the conductive layer pattern 21a by forming a hemispherical grain silicon (HSG) surface layer 21b on the conductive layer pattern 21a. In particular, the HSG layer 21b may be formed by loading the substrate 10 into a reaction chamber and maintaining an ultra-high vacuum of less than about $10^{-6}$ torr therein while simultaneously exposing the conductive layer pattern 21a to an injected silane (SiH$_4$) or disilane (Si$_2$H$_6$) gas so that a high concentration of silicon seed crystals can be formed as silicon nuclei on the surface of the conductive layer pattern 21a. Flow of the injected silicon containing gas is then terminated. The seed crystals are then grown at a preferred temperature in a range between about 560 and 620° C. This growth step may have a duration of sufficient length so that an average grain size of 1000 Å may be achieved from the seed crystals. As will be understood by those skilled in the art, other conventional techniques to form and grow silicon seed crystals as single crystal grains may also be used to increase the effective surface area of the conductive layer pattern 21a.

As determined by the inventors herein, the size and uniformity of the single crystal grains in the HSG surface layer 21b may be influenced by, among other things, the concentration of dopant impurities in the conductive layer pattern 21a. In particular, an inverse relationship was determined by the inventors between the impurity concentration in the conductive layer pattern 21a and the size and uniformity of the resulting single crystal grains. Thus, by at least initially limiting the concentration of first conductivity type dopant impurities in the conductive layer pattern 21a, the surface area of a lower capacitor electrode 21 comprising the conductive layer pattern 21a and HSG surface layer 21b thereon may be increased.

Figure 7:
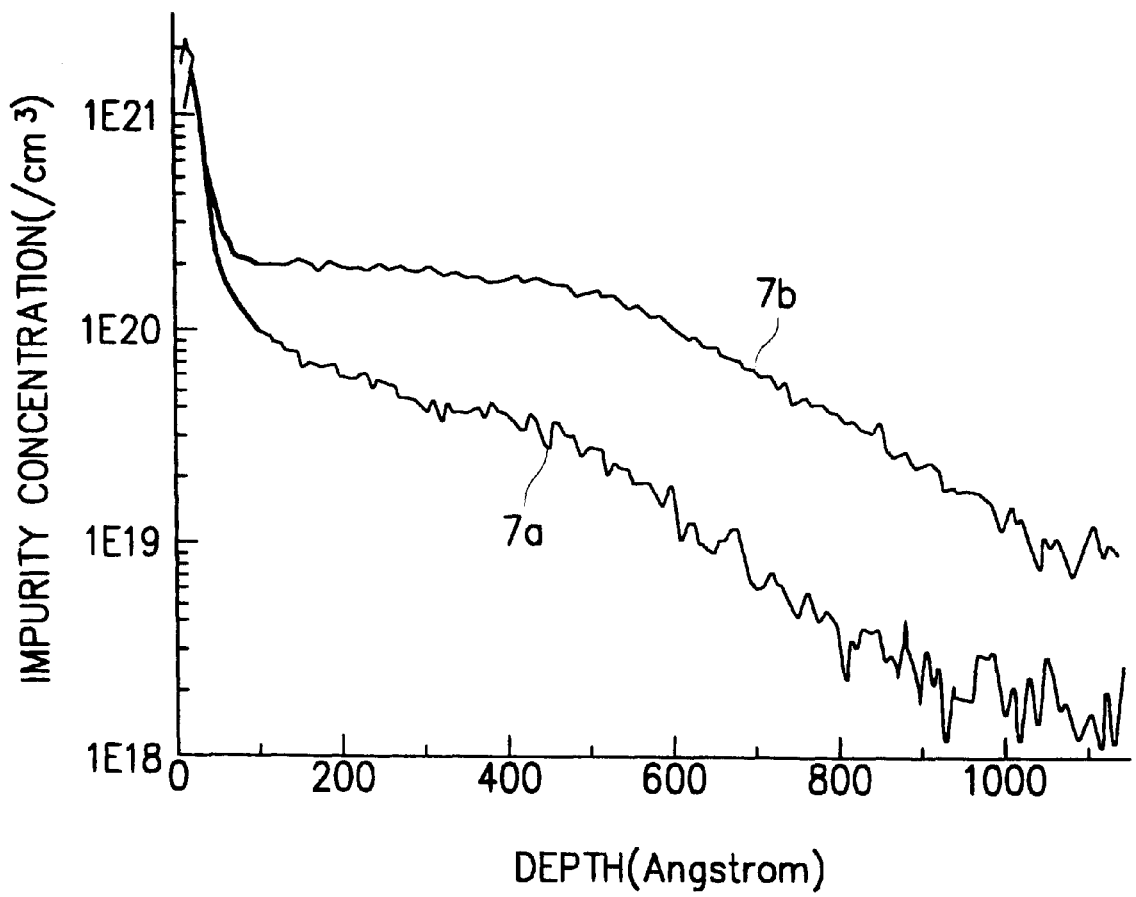
FIG. 7 illustrates comparative graphs of dopant impurity concentration (y-axis) versus diffusion depth (x-axis) for a crystallized conductive layer pattern (7b) and a noncrystallized conductive layer pattern (7a).

As illustrated best by Block 1d, the conductive layer pattern 21a and the seeded HSG surface layer 21b thereon are then annealed at a preferred temperature in a range between about 550 to 900° C. In particular, the conductive layer pattern 21a and seeded HSG surface layer 21b are preferably annealed at a temperature of about 800° C. for about 30 minutes, to crystallize the amorphous conductive layer pattern 21a as a polycrystalline layer. This step to anneal the conductive layer pattern 21a as a polycrystalline layer also enhances the rate at which additional dopant impurities may be incorporated into the conductive layer pattern 21a using such techniques as diffusion of dopant impurities. This enhanced rate of incorporation can be illustrated best by FIG. 7. In particular, FIG. 7 illustrates comparative graphs of dopant impurity concentration (y-axis) versus diffusion depth (x-axis) for a crystallized conductive layer pattern (7b) and a noncrystallized conductive layer pattern (7a). As illustrated, the dopant impurity concentration in the crystallized conductive layer pattern (7b) is greater at all diffusion depths than the dopant impurity concentration in the noncrystallized conductive layer pattern (7a).

Referring now to Block 1e of FIG. 1A, a cleaning step is again performed to remove contaminants, if any, from the exposed surfaces of the HSG surface layer 21b. Like the cleaning step of Block 1b, the cleaning step of Block 1e is preferably performed to remove any native oxide film (not shown) which may have formed on the HSG surface layer 21b. The cleaning step may include exposing the composite layer comprising the HSG surface layer 21b and the now polycrystalline conductive layer pattern 21a to a wet cleaning agent such as a hydrofluoric acid (HF) solution or buffered oxide etchant (BOE).

Referring now to Block 1f, the composite polycrystalline layer 21 containing the HSG surface layer 21b and the crystallized (and doped) conductive layer pattern 21a are then doped with a dopant impurity of first conductivity type. This first conductivity type dopant impurity may be an N-type dopant such as phosphorus (P). Techniques for doping the composite polycrystalline layer 21 may include ion-implantation followed by diffusion or a diffusion method using a liquid source such as POCl$_3$. However, it may be difficult to achieve dopant uniformity near the surface of the composite polycrystalline layer 21 when ion implantation is performed because the sidewalls of the single crystal grains on the surface of the composite polycrystalline layer 21 may not receive uniform exposure to the substantially vertical ion implantation beam. Use of a liquid source such as POCl$_3$ is also not preferred because such a source may cause the formation of a glassy layer if chemical reaction between the liquid source compound and the silicon in the composite layer occurs.

Instead, a preferred technique for doping the composite polycrystalline layer 21 includes exposing the layer 21 to a phosphine (PH$_3$) gas in a reaction chamber. Here, a rapid thermal processing (RTP) apparatus may be used to ensure that integrity of the grain structure (e.g., size and uniformity) in the composite polycrystalline layer 21 is maintained during the doping step. In particular, the RTP apparatus is operated to provide a rapid ramp-up in temperature to a desired diffusion temperature ("sustainment temperature") and then sustain the desired diffusion temperature for a short duration (i.e., short sustainment period). As determined by the inventors herein, a slow ramp-up in temperature and/or a relatively long sustainment period using a furnace-type diffusion process may degrade the leakage and voltage breakdown characteristics of a subsequently formed capacitor comprising the composite polycrystalline layer 21. Accordingly, diffusion of the first conductivity type impurity (e.g., phosphorus) is preferably performed in a RTP processing apparatus which is maintained at a pressure of about 120 torr and thermally ramped at a rate of 10° C./sec to a sustainment temperature of about 800° C. This sustainment temperature is maintained for about 300 seconds prior to ramp-down at a similar rate. The sustainment temperature may be selected at a level in a range between about 550 and 900° C. and the pressure in the RTP processing apparatus may be selected in a range between about 5 and 500 torr. The ramp-up rate may also be increased provided that the single crystal grains in the HSG surface layer 21b do not become deformed. During RTP processing, the flow rate of phosphine gas may be set at a rate of 270 sccm (standard cubic centimeters per minute) and a flow rate of hydrogen gas may be set at approximately 9.5 slm (standard liters per minute).

Using these preferred steps, a composite polycrystalline silicon layer 21 can be formed having a first conductivity type dopant concentration therein of about $3 \times 10^{20}$ dopants/cm$^3$ to a preferred depth from the upper surface of the composite layer 21. This depth is selected to prevent depletion layer expansion when the capacitor is reverse biased. At depths greater than the preferred depth (e.g., 50 Å), the background dopant impurity concentration of less than about $10^{20}$ dopants/cm$^3$ will still be present. Instead of RTP processing, the dopant diffusion process may be performed for a relatively long sustainment duration (relative to RTP processing) in a LPCVD chamber, at a low pressure in a range between about 1 to 3 torr and at a temperature in a range between about 650 and 850° C. Referring now to Block 1g, a diffusion barrier layer 22 (e.g., $Si_3N_4$) is then formed on the HSG surface layer 21b to prevent out-diffusion of dopants from the HSG surface layer 21b. This aspect of the present invention is more fully described hereinbelow with respect to FIGS. 9A–9B.

Referring now to Blocks 1h and 1i, a dielectric layer 23 and an upper electrode 24 are sequentially formed on the diffusion barrier layer 22. Preferably, the barrier layer 22 and dielectric layer 23 are formed in the same RTP chamber following the doping of the HSG surface layer 21b, in order to inhibit oxidation of the HSG surface layer 21b and eliminate or at least reduce the duration of the cleaning steps. The diffusion barrier layer 22 and dielectric layer 23 may be formed of various dielectric materials including a nitride-oxide (NO) composite. Still other dielectrics include $TiO_2$, $SrTiO_3$, $BaTiO_3$, $(Ba,Sr)TiO_3$ or $Pb(Zr,Ti)O_3$, for example. When a nitride-oxide composite is used, the nitride portion of the composite is used as a diffusion barrier layer, as explained below.

Referring now to FIGS. 3A–3C and 4–6, graphical illustrations of capacitance curves for capacitors formed in accordance with the present invention, are provided. In particular, the data for the curves was obtained from capacitors formed from amorphous silicon conductive layer patterns 21a having a surface area (increased by the HSG surface layer 21b) of 89,600 $\mu m^2$ and an initial impurity concentration of about $3.7 \times 10^{19}$ dopant impurities/cm$^3$. The nitride-oxide composite had an equivalent oxide thickness of about 50 Å, in a preferred range of thicknesses between about 40 Å to 70 Å.

Figure 3A:
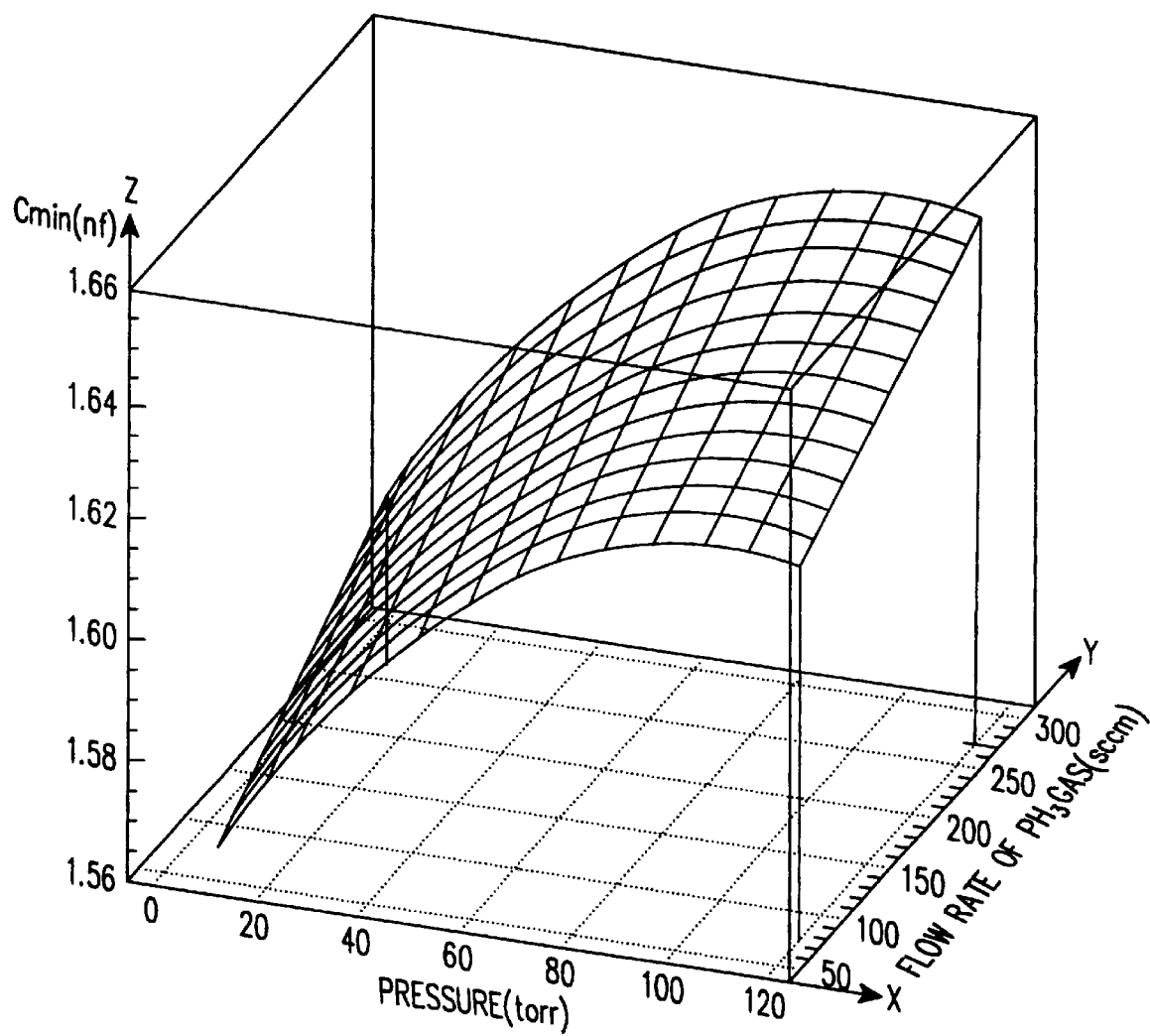
FIGS. 3A–3C are three-dimensional graphical illustrations of capacitance versus a plurality of processing conditions, for HSG capacitors formed in accordance with the present invention.
Figure 3B:
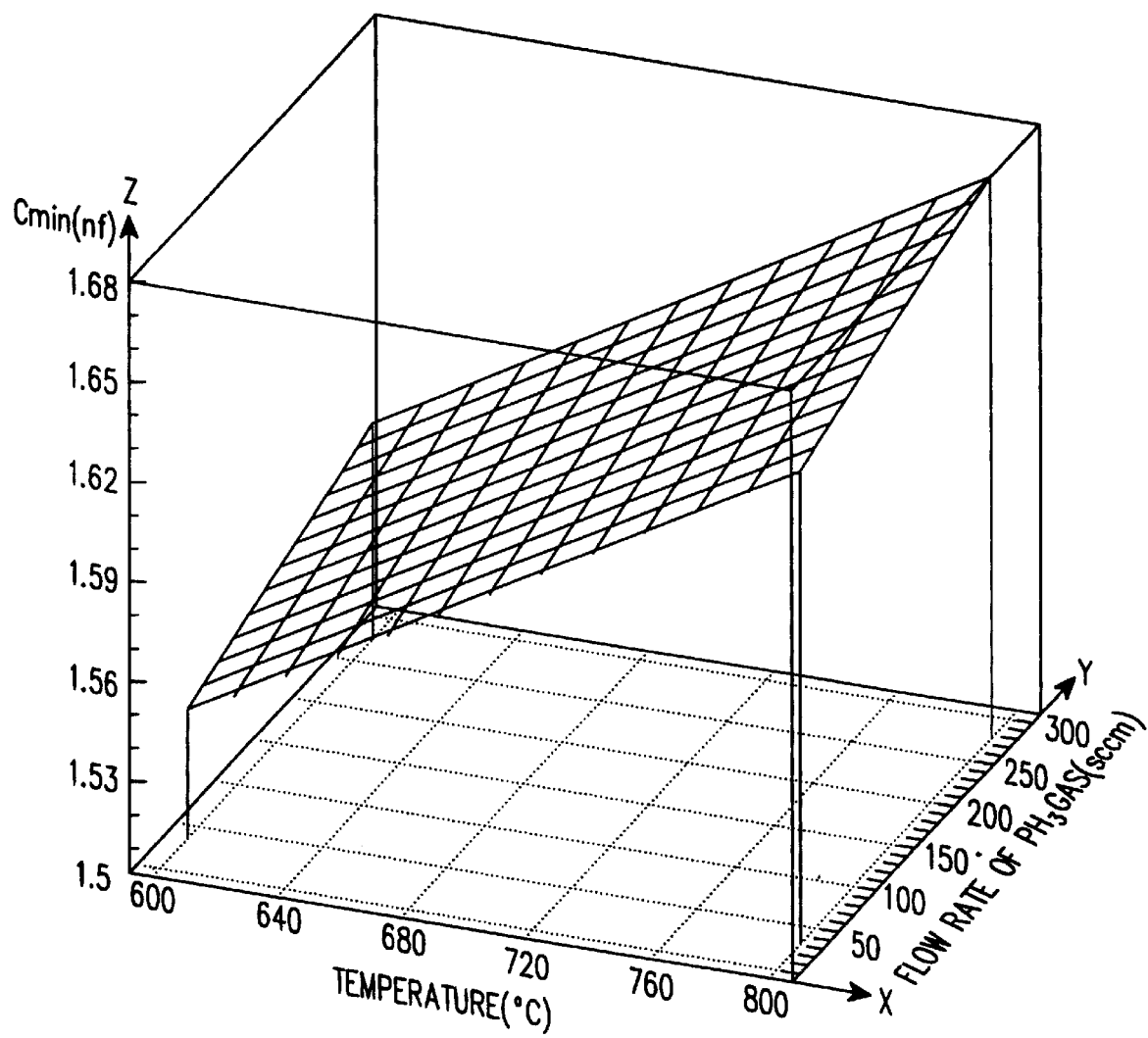
Figure 3C:
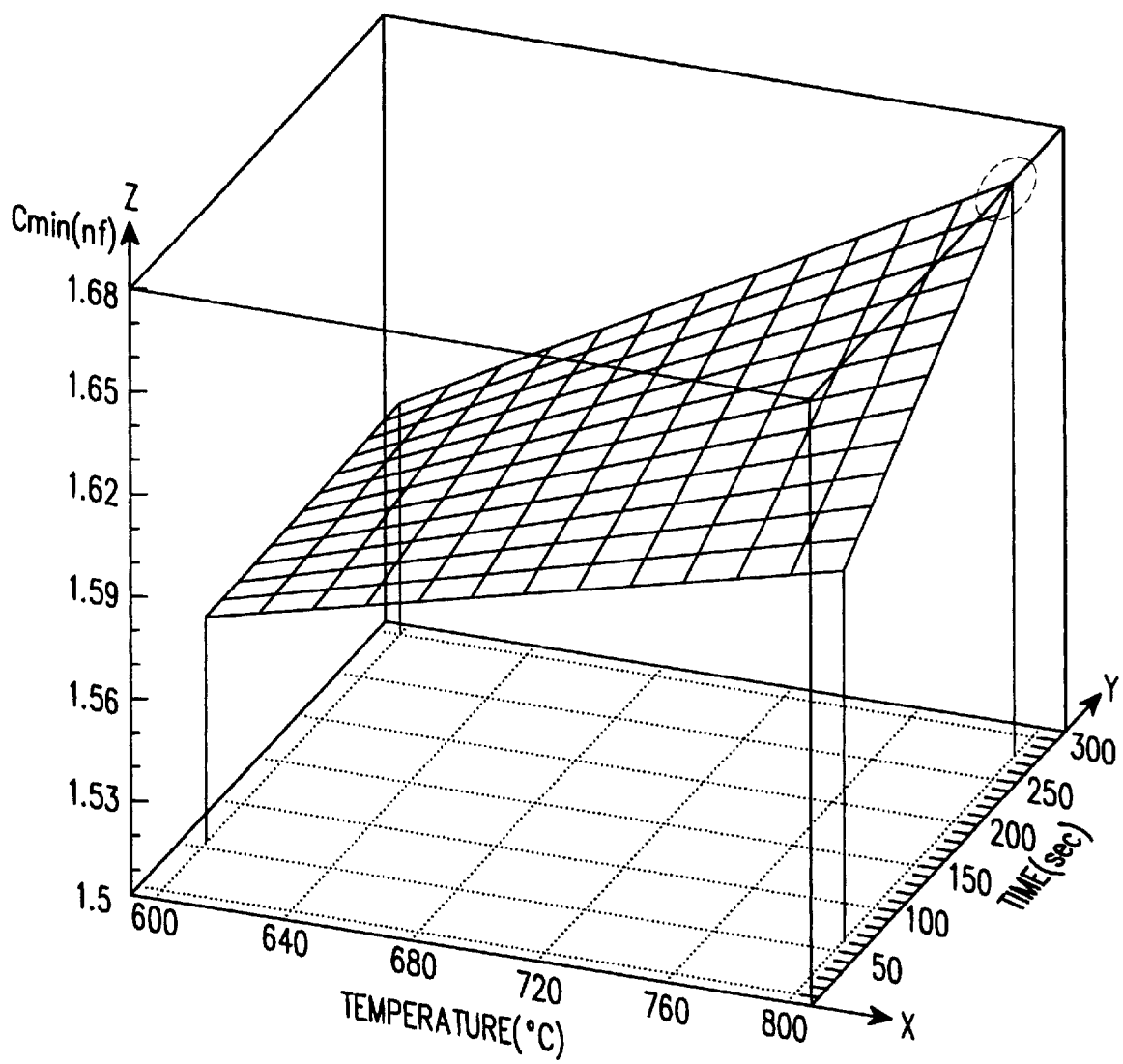

Referring now to FIGS. 3A–3C, three-dimensional surface graphs are provided which illustrate variations in minimum capacitance (Cmin) of a HSG capacitor, as a function of processing conditions. The Cmin condition was obtained by applying a voltage of –1.5 V to the upper electrode and grounding the lower electrode of the capacitor. FIGS. 3A–3C illustrate an iterative process for determining optimal RTP conditions for obtaining the most preferred HSG lower electrode. Parameters, such as RTP chamber pressure, flow rate of $PH_3$, temperature and sustainment duration were controlled. In FIG. 3A, the sustainment temperature and sustainment duration were fixed at about 800° C. and 300 seconds, respectively. As illustrated by FIG. 3A, a significant change in Cmin is observed as a function of pressure and a chamber pressure of about 120 torr should be maintained to obtain preferred Cmin characteristics. A significant fall-off in Cmin was also observed for pressures less than 60 torr. FIG. 3A also illustrates that Cmin is less sensitive to the phosphine flow rate relative to pressure. Nonetheless, a flow rate of 200 sccm or greater, preferably about 270 sccm, should be selected to achieve a high Cmin value.

In FIG. 3B, the chamber pressure and sustainment duration were fixed at about 120 torr and 300 seconds, respectively. Like FIG. 3A, FIG. 3B shows that the dopant flow rate for phosphine has relatively minimal impact on the value of Cmin, however, the value of Cmin can be influenced significantly by the diffusion temperature and a sustained diffusion temperature of about 700° C. or greater, such as 800° C., is preferred. In FIG. 3C, the chamber pressure and phosphine dopant flow rate were fixed at about 120 torr and 270 sccm, respectively. Based on FIG. 3C, a sustainment duration of 200 seconds or greater, preferably about 300 seconds, is preferred. In summary, FIGS. 3A–3C demonstrate that variations in processing parameters can significantly impact desired Cmin values.

Figure 4:
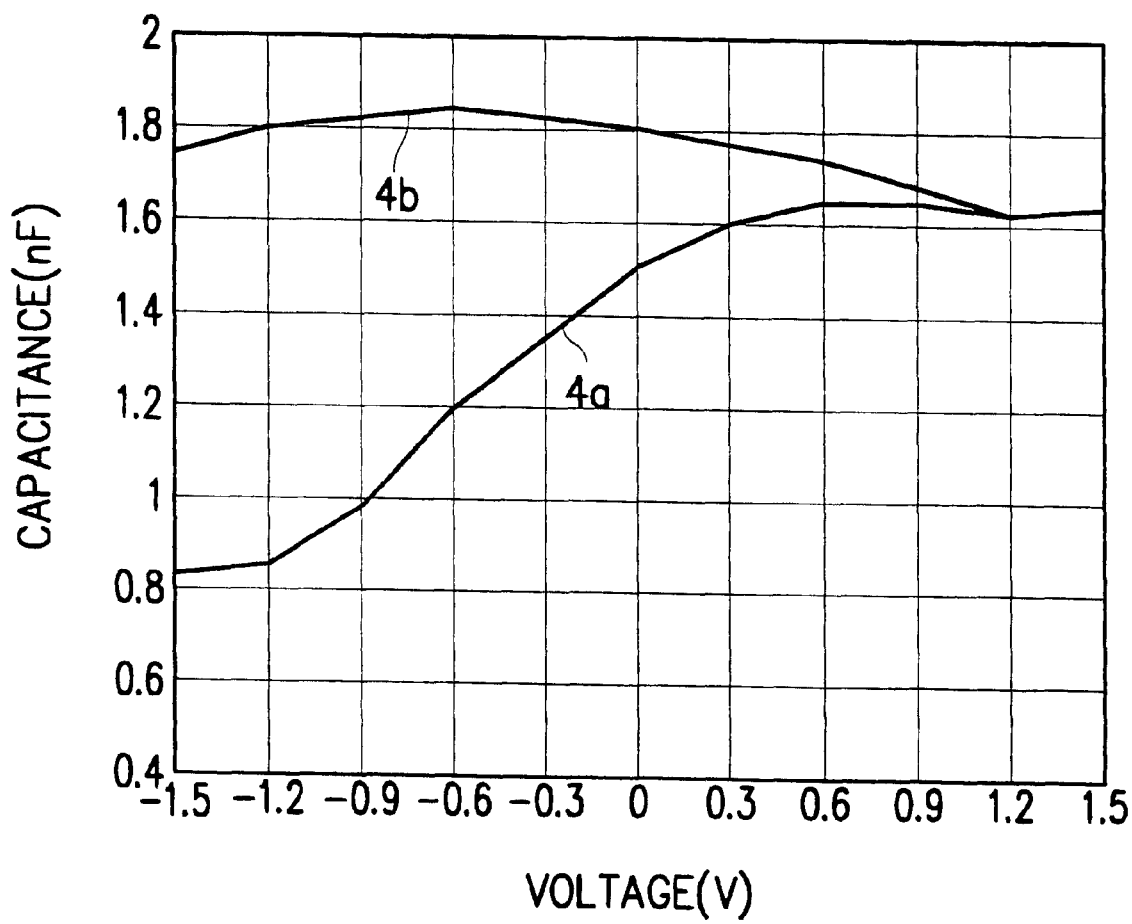
FIG. 4 is a graphical illustration of a capacitance response curve (4a) of a conventional HSG capacitor and a capacitance response curve (4b) of a HSG capacitor formed in accordance with the present invention.

Referring now to FIG. 4, the capacitance of a conventional HSG capacitor (curve 4a) is compared to the capacitance of a capacitor formed in accordance with the present invention (curve 4b). The capacitance data of curve 4b was obtained from a preferred HSG capacitor processed using RTP doping at a sustainment temperature of about 800° C. and at a chamber pressure of about 120 torr. The phosphine flow rate was also set at about 270 sccm and the sustainment duration was about 300 seconds. The results indicate that, for a range of voltages from Cmin (–1.5V) to Cmax (1.5V), higher and significantly more stable capacitance characteristics can be obtained for the HSG capacitor of the present invention (curve 4b) relative to a conventional HSG capacitor (curve 4a). In particular, FIG. 4 demonstrates that Cmin for a conventional HSG capacitor (undoped) is about 0.8 nF, which is similar to a non-HSG capacitor. Thus, the increased surface area contributed by the conventional HSG lower electrode provided no real benefit when the source became reverse biased (i.e., at –1.5V). By contrast, the HSG capacitor of the present invention maintained a Cmin/Cmax (1.7 nF/1.65 nF) ratio of greater than 1.0, showing stable and greater capacitance over both the conventional planar and conventional HSG capacitors for the specified range of voltage. The results of FIG. 4 can be attributed to the greater concentration of impurity maintained in the lower HSG electrode in comparison to that of the upper electrode. The heavier concentration of impurity in the lower electrode, resulting from the preferred second RTP doping step illustrated by Block 1f of FIG. 1A, ensures a reduction in depletion layer thickness during operation, and a restoration of conductivity which may be initially lost during formation of the HSG surface layer 21b.

Figure 5:
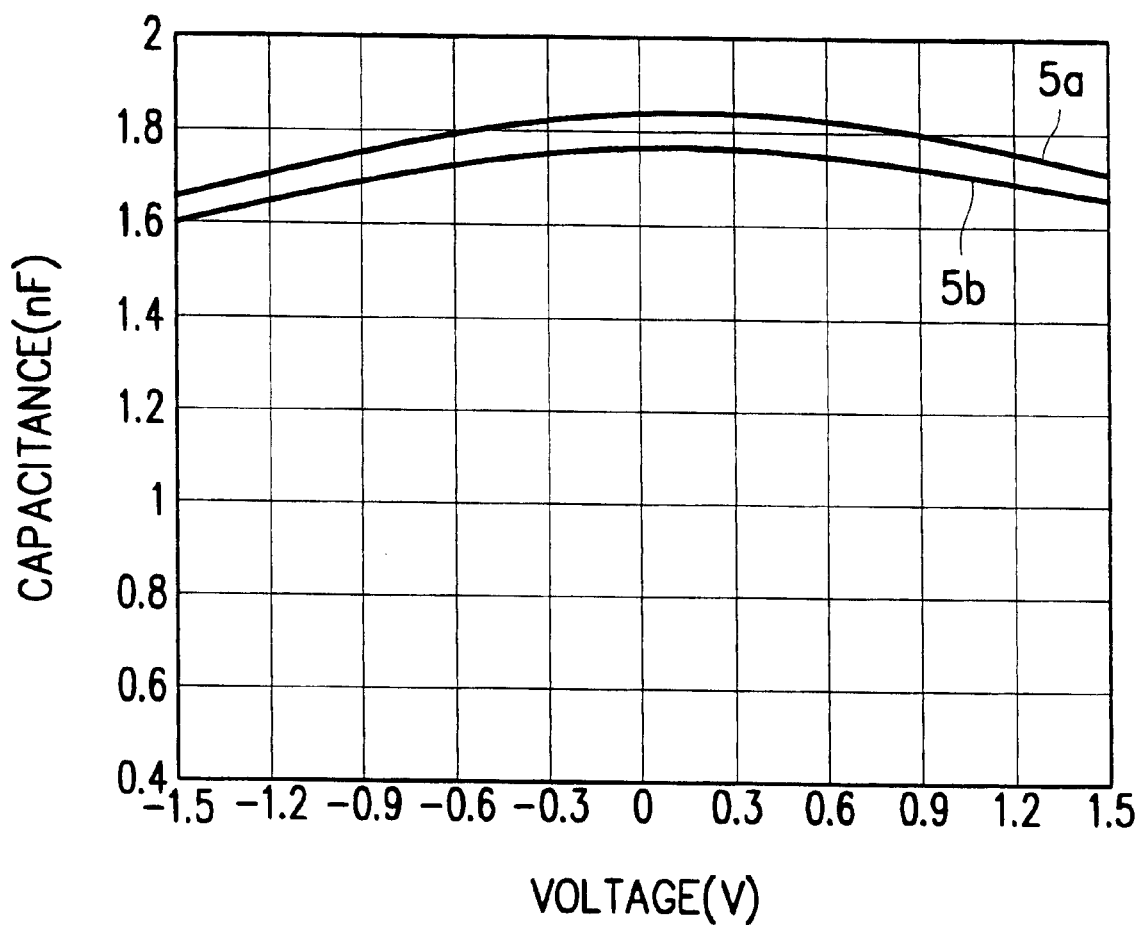
FIG. 5 is a graphical illustration of capacitance response curves for HSG capacitors formed in accordance with the present invention.

Referring now to the graph of capacitance versus voltage in FIG. 5, a consequence of raising the RTP doping sustainment temperature on the capacitance of a preferred HSG capacitor can be illustrated. Here, the surface of the lower electrode was doped with phosphine gas through RTP. The flow rate of the phosphine gas was set at about 270 sccm, and the RTP chamber pressure was held at about 120 torr. The sustainment duration was also set at about 300 seconds. The sustainment temperature was achieved by ramping temperature at a rate of about 10° C./sec from a standby temperature of about 620° C. As illustrated by curve 5a of FIG. 5, no change in capacitance occurred when the sustainment temperature was set at 800° C., 825° C. or 850° C. However, as the sustainment temperature was increased to 875° C. (at a ramping rate of 10° C./sec), the overall capacitance, as illustrated by curve 5b, degraded because the single crystal grains in the HSG surface became deformed. As determined by the inventors herein, reducing the ramping rate to about 2° C./sec for sustainment temperatures greater than about 850° C. (up to 900° C.), prevented the grain deformation and the reduction in capacitance illustrated by curve 5b.

Figure 6:
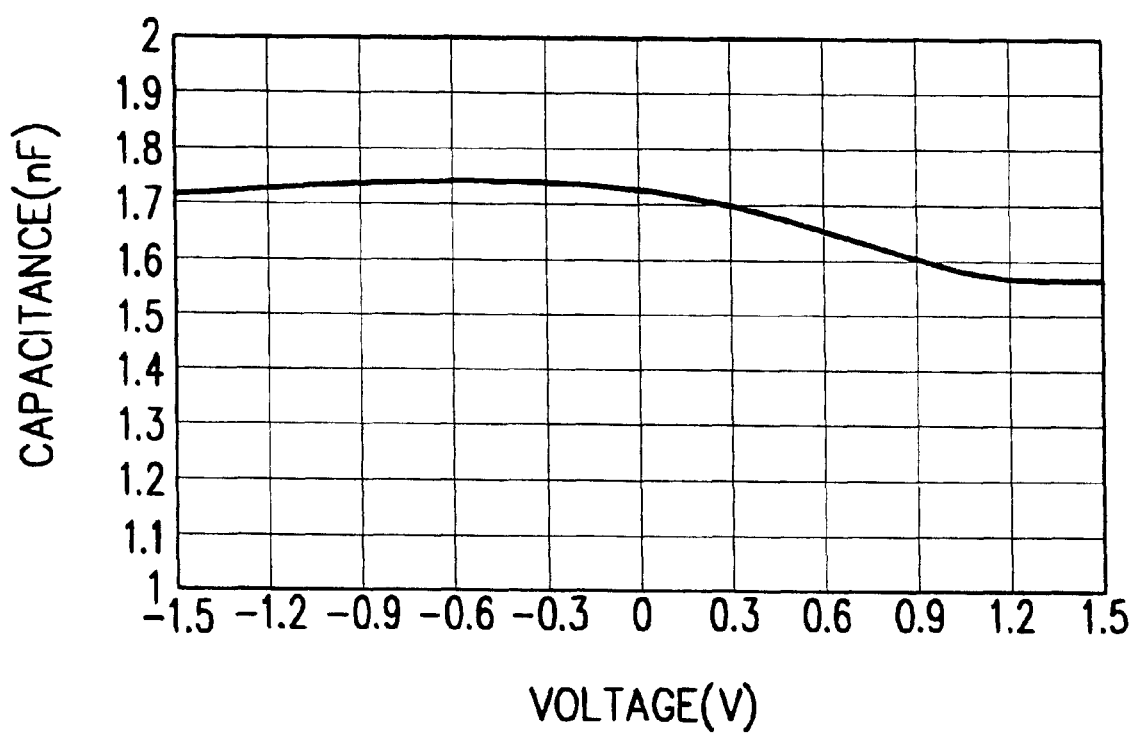
FIG. 6 is a graphical illustration of a capacitance response curve for a HSG capacitor formed in accordance with the present invention.

Referring now to FIG. 6, a curve of capacitance versus voltage is illustrated for a HSG capacitor formed using a LPCVD doping method, as described above. Here, the surface of the lower HSG electrode was doped at a furnace temperature of about 700° C., a phosphine flow rate of about 900 sccm was established in the CVD chamber at a chamber pressure of about 1.5 torr. The duration of the LPCVD doping step was about 3 hours. Again, the results were favorable and similar to the RTP method, yielding a ratio of Cmin/Cmax (1.7 nF/1.6 nF) of greater than 1.0.

According to a further aspect of the present invention, the application of $PH_3$ to increase the impurity concentration in the HSG surface layer may be performed using a plasma discharge process at a low pressure of about 0.5–1 torr. Depending on the reaction environment, the radio frequency (RF) power to sustain the plasma can be as high as 2000 Watts, but is typically only about 100 w, and the $PH_3$ flow rate can be set at a value between about 1 and 500 sccm for a corresponding duration between about 60 minutes and 1 second. The typical flow rate is about 300 sccm. Each of the above described doping steps (RTP, LPCVD and plasma) may be followed by an annealing process.

Figure 8:
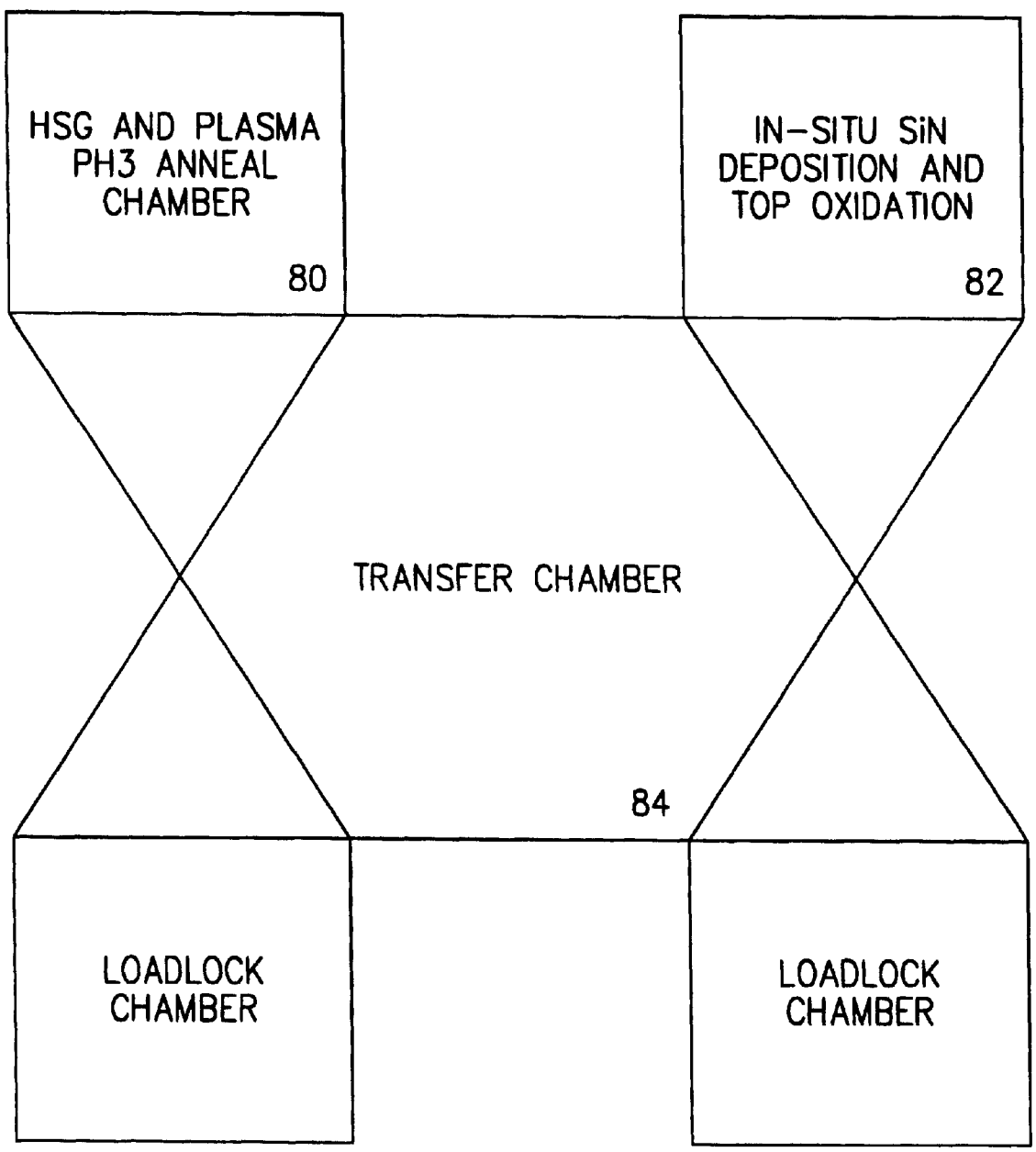
FIG. 8 is a plan view of a multi-chamber processing apparatus for performing processing steps in accordance with the present invention.

FIG. 8 illustrates an exemplary embodiment of a multi-chamber apparatus in which a transfer chamber 84 operates to transfer the substrate having a conductive pattern layer 21a thereon from a first chamber 80 to a second chamber 82 while maintaining the same pressure environment in all three chambers. In the apparatus, the first chamber 80 is used to form the HSG surface layer 21b on the conductive layer pattern 21a, perform doping through plasma ($PH_3$) discharge, and anneal the doped HSG surface layer 21a. The substrate is then transferred to the second chamber 82, without breaking vacuum. In the second chamber 82, a silicon nitride (SiN) layer and a top oxidation layer are deposited to form a dielectric layer.

Figure 9A:
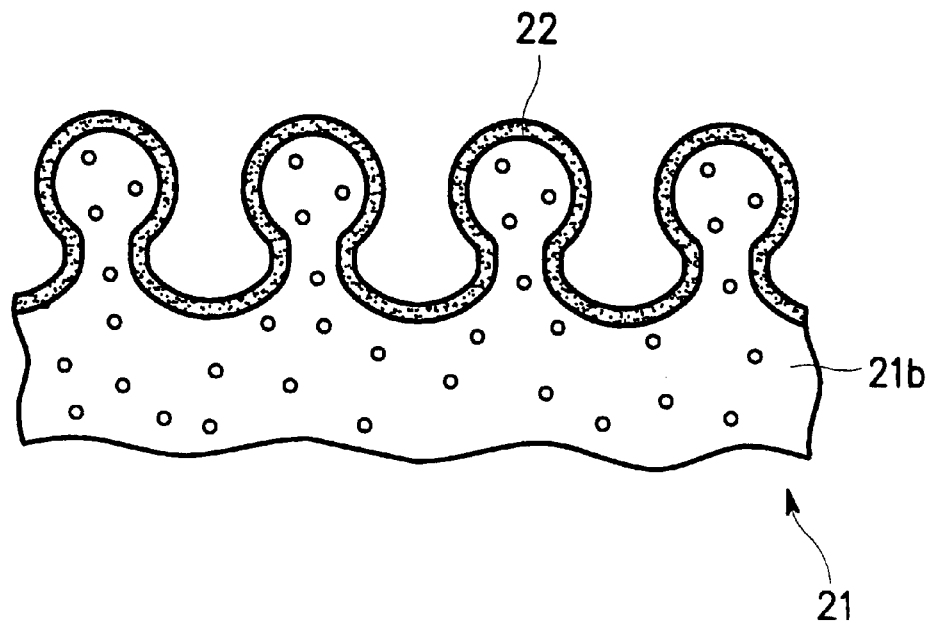
FIGS. 9A and 9B are cross-sectional views of intermediate capacitor structures which illustrate methods of forming HSG capacitors in accordance with the present invention.
Figure 9B:
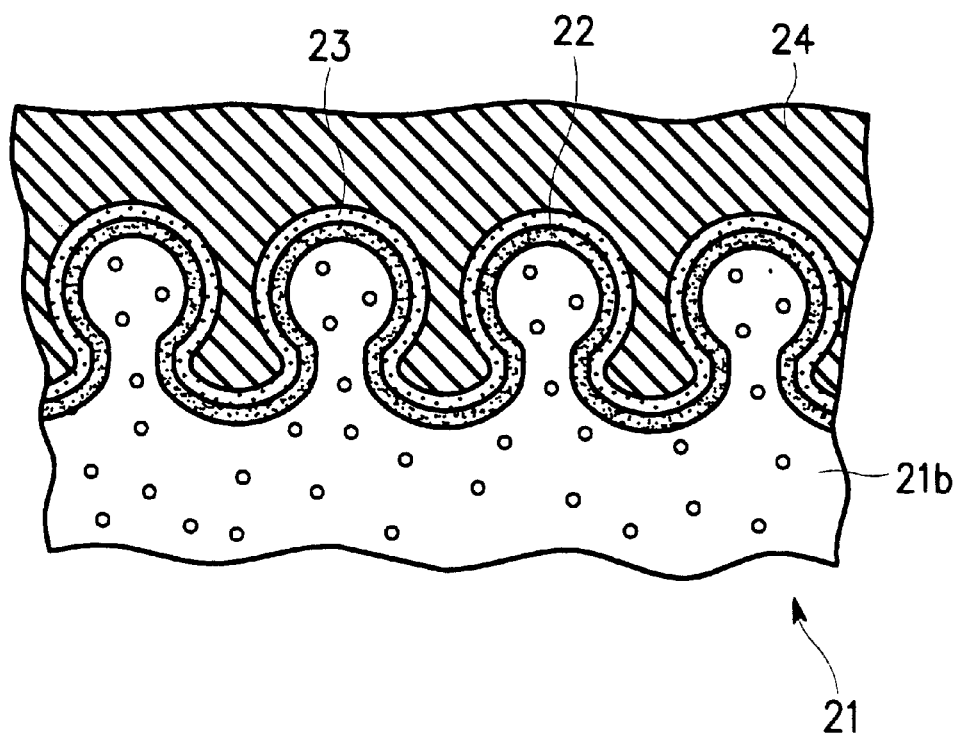

Referring now to FIGS. 9A and 9B and Block 1g of FIG. 1, additional aspects of the present invention will be described. According to this embodiment, a diffusion barrier layer 22 is formed between a phosphorous-doped HSG surface layer 21b and a dielectric layer 23. As determined by the inventors herein, the diffusion barrier layer 22 improves the characteristics of capacitors by inhibiting out-diffusion of dopant impurities from the HSG surface layer 21b to the dielectric layer 23, during subsequent processing. In contrast to a reaction barrier which may only prevent two materials from reacting with each other to produce a potentially harmful byproduct, a diffusion barrier layer should be of sufficient thickness to prevent reaction and prevent atomic migration between two adjacent regions. For example, certain dielectric materials, such as tantalum oxide ($Ta_2O_5$), are advantageous as capacitor dielectric materials because they have high dielectric strengths (i.e., have high dielectric constants).

However, steps to form such dielectric materials on silicon-based conductive layers may require high thermal treatments and such thermal treatments may cause adverse reactions between these dielectric materials (e.g., $Ta_2O_5$) and the underlying silicon-based conductive layers. For example, reactions between $Ta_2O_5$ and silicon may cause the formation of a parasitic silicon dioxide ($SiO_2$) layer which can lead to a reduction in the surface area of the HSG surface layer 21b and reduce the effective dielectric strength of the combined dielectric layer including the parasitic layer (with relatively low dielectric strength) and the $Ta_2O_5$ layer. The diffusion barrier layer 22 should also be of sufficient thickness to prevent out-diffusion of dopant impurities from the HSG surface layer 21b having a high dopant concentration therein) to the dielectric layer 23, because such out-diffusion can reduce the conductivity of the lower capacitor electrode and thereby adversely impact capacitance stability (i.e., the Cmin/Cmax ratio). Thus, techniques to prevent impurity out-diffusion from the HSG surface layer include selecting a diffusion barrier as a material which is relatively nonreactive with silicon or the selected dielectric material, has sufficient thickness to prevent reaction between the HSG surface layer 21b and the selected dielectric layer 23 and has sufficient thickness to prevent appreciable out-diffusion of dopants from the HSG surface layer 21b. Preferred diffusion barrier materials include silicon nitride (SiN).

According to another preferred aspect of the present invention, the diffusion barrier layer 22 may be formed using a chemical vapor deposition (CVD) step. This CVD step may be performed in a cluster CVD apparatus containing a load-lock mechanism and a vacuum control device. In particular, after formation of the HSG surface layer 21b (and the removal of any native oxide layer thereon, if necessary), a SiN diffusion barrier layer 22 may be deposited by injecting a combination of gases, including ammonia, diclorosilane ($Si_2H_2Cl_2$) as a precursor, and hydrogen, into a CVD chamber maintained at a temperature of about 650° C. The flow rates of ammonia, $Si_2H_2Cl_2$, and hydrogen may be set at levels of about 900 sccm, 30 sccm, and 20 slm (standard liters per minute), respectively. The CVD chamber pressure is also preferably set at a level of 100 torr. As will be understood by those skilled in the art, these parameters, such as temperature, pressure, and flow rates may change depending on the type processing apparatus used.

Figure 11:
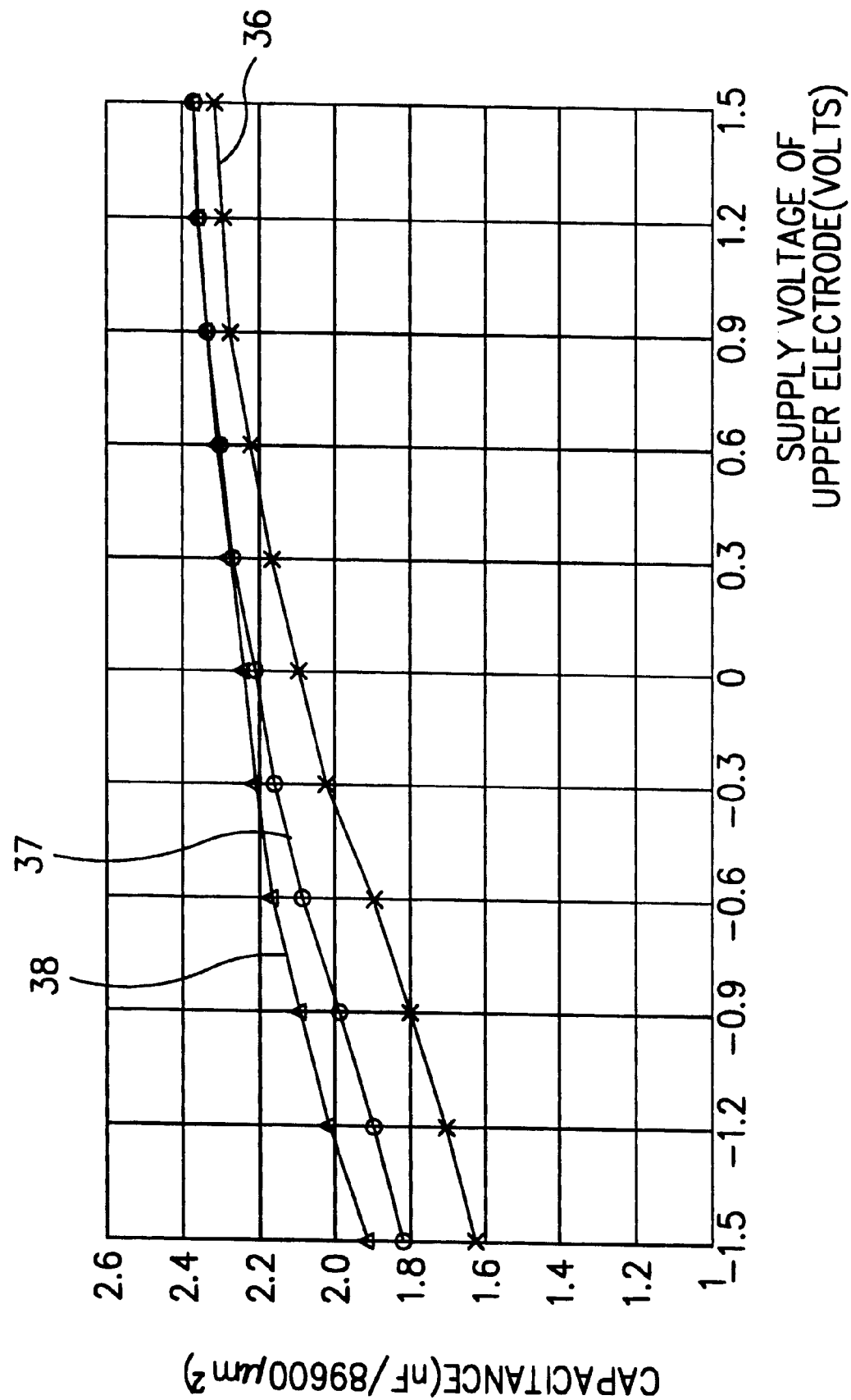

The diffusion barrier layer 22 may be formed to have a thickness in a range between about 5 Å and 100 Å. Here, a barrier layer 22 of substantial thickness may be preferred to inhibit out-diffusion and parasitic reaction between the HSG surface layer 21b and the dielectric layer 23, however, increases in diffusion barrier layer 22 thickness may result in a reduction in capacitance if the diffusion barrier layer 22 is made of a material having a lower dielectric strength than the dielectric strength of the selected dielectric layer 23 and/or if the combined thickness of the diffusion barrier layer 22 and dielectric layer 23 exceeds a desired level. For example, FIG. 11 illustrates curves of capacitance versus voltage for capacitors having CVD silicon nitride diffusion barrier layers 22. Each graph corresponds to a capacitor having a lower electrode surface area of about 89600 $\mu m^2$. Curve 38 of FIG. 11 illustrates capacitance versus voltage characteristics for a capacitor having a 20 Å thick silicon nitride diffusion barrier layer 22. Curves 36 and 37 illustrates capacitance versus voltage characteristics for capacitors having silicon nitride diffusion barrier layer 22 thicknesses of 10 Å and 15 Å. To achieve optimized capacitance characteristics, the diffusion barrier layer 22 should have a thickness in a range between about 10 Å and 30 Å, to sufficiently prevent expansion of a depletion layer formed within the lower electrode 21 by preventing out-diffusion from the HSG surface layer 21b. As indicated previously, an expansion of the depletion layer may adversely impact capacitance stability when the voltage across the capacitor is reversed.

According to another aspect of the present invention, the barrier layer 22 may be formed by initially forming a first layer of silicon nitride using a rapid thermal nitridation (RTN) process on the HSG surface layer 21b and then forming a second layer of silicon nitride on the first layer, using a CVD method. Formation of the first layer of silicon nitride may occur by applying a compound gas, such as ammonia ($NH_3$), at high temperature to the HSG surface layer 21b. The silicon atoms required for formation of the first layer may be provided by the HSG surface layer 21 which means that a separate silicon source is not required for RTN processing. However, removal of silicon from the HSG surface layer 21 may result in a reduction in the surface area of the lower capacitor electrode and a concomitant reduction in capacitance.

As determined by the inventors herein, RTN processing also reduces the amount of leakage current which may occur when the lower capacitor electrode 21 is formed with an uneven or three dimensional electrode surface. Also, due to fast reaction time, RTN processing may inhibit heat related out-diffusion of dopants from the HSG surface layer 21b. In contrast, CVD processing may result in greater out-diffusion because the duration of CVD processing is typically greater than RTN processing. Moreover, if RTN processing does not provide a first layer of silicon nitride having a sufficient barrier layer thickness, the second layer of silicon nitride may be formed to provide this additional thickness. Accordingly, RTN processing may be provided to inhibit out-diffusion and improve leakage current characteristics and then CVD processing may be followed to provide additional thickness to the nitride barrier layer 22.

According to a further aspect of the present invention, the barrier layer 22 may also be doped in-situ with a first conductivity type dopant (e.g., phosphorus) to further prevent out-diffusion of first conductivity type dopants from the HSG surface layer 21b by preventing the formation of a negative dopant gradient across the interface between the HSG surface layer 21b and the barrier layer 22. Here, a doped RTN process and/or doped CVD process may be performed to further inhibit diffusion of dopant impurities from the HSG surface layer 21b to the barrier layer 22.

In the event a doped RTN process is used, a first conductivity type impurity source, such as $PH_3$, and a reaction (i.e., nitride) source, such as $NH_3$, may be applied over the HSG surface layer 21b to form a phosphorous-doped silicon nitride (SiN) diffusion barrier layer 22. In the event a doped CVD process is used, a combination of source gases for both SiN and the desired dopant may be vapor deposited over the HSG surface layer 21b. As described above, this latter method of forming a silicon nitride barrier layer 22 results in no consumption of silicon from the surface of the HSG surface layer 21b.

In the doped RTN process, the HSG surface layer 21b may be exposed in a chamber to $PH_3$ and $NH_3$ gases so that a phosphorous-doped SiN diffusion barrier layer 22 is formed. Here, the $NH_3$ gas is provided to react with the silicon in the HSG surface layer 21b and form a first silicon nitride layer and the $PH_3$ gas provides the phosphorous dopant to this layer. The chamber may be maintained at a pressure in the range of about 5 to 500 torr and the temperature may be set at a level in a range between about 500 and 900° C. The doped CVD process may be conducted in a CVD chamber, by exposing the HSG surface layer 21b to $SiH_4$ (or $SiH_2Cl_2$), $PH_3$ and $NH_3$ gases. The CVD reaction chamber may be maintained at a pressure in the range of 0.1 to 200 torr and at a temperature in the range of 550 to 850° C.

According to still another aspect of the present invention, a rapid thermal oxidation (RTO) process may be performed to enhance the electrical properties of the nitride barrier layer 22. In this process, the diffusion barrier layer 22 is exposed to oxygen and nitrogen gases (each at a rate of about 8 slm) for about 120 seconds. The RTO process may be conducted in a heated chamber while maintaining the wafer at a temperature of about 850° C.

Following the formation of a diffusion barrier layer 22, a dielectric layer 23 is formed on the diffusion barrier layer 22. In the preferred embodiment, a dielectric layer comprising a high dielectric material, such as tantalum oxide ($Ta_2O_5$), is formed on the barrier layer 22. This dielectric layer 23 may be formed using a CVD technique, by exposing the barrier layer 22 to a $Ta(OC_2H_5)_5$ precursor and oxygen at rates of about 300 sccm and 1 slm, respectively. Here, a CVD reaction chamber can be maintained at a temperature of about 410° C., and a pressure of about 400 milli-torr. Typically, the desired thickness of the CVD-deposited $Ta_2O_5$ dielectric layer 23 is about 60 Å. The dielectric layer 23 is then subjected to a densifying process to, among other things, improve the physical properties of the diffusion barrier layer 22 thereunder. The densifying process may involve applying dry oxygen over the dielectric layer 23 for about 30 minutes in a reaction chamber which is maintained at a temperature of about 800° C. The densifying process may force out any undesirable impurities in the $Ta_2O_5$ dielectric layer 23, such as carbon, and improve the physical properties of the SiN barrier layer 22.

The dielectric layer 23 may also be formed by forming multiple layers of $Ta_2O_5$ and conducting a $UV-O_3$ treatment process on each layer before forming the next layer of $Ta_2O_5$ thereon. For example, after a first $Ta_2O_5$ layer is formed (typically having a thickness of about 30 Å), a UV-O3 process may be performed by irradiating the first $Ta_2O_5$ layer with ultra-violet light for about 15 minutes in a reaction chamber heated to about 300° C. and filled with ozone gas. The same process is then repeated after a second $Ta_2O_5$ layer (having a thickness of about 30 Å, for example) has been formed on the first $Ta_2O_5$ layer. Finally, the dual dielectric layer 23 may be exposed to dry oxygen for about 30 minutes at a temperature of about 800° C. The densifying process may also be performed using a rapid thermal annealing process which includes a $N_2O$ gas at a chamber temperature of about 800° C., or a wet oxidation technique.

As an additional step in forming a capacitor, an upper electrode 24 is formed over the dielectric layer 23. One of the preferred materials for the upper electrode is titanium nitride. Other materials include tungsten nitride, a bi-layer of titanium nitride and a refractory metal silicide, a bi-layer of titanium nitride and poly-silicon, a multi-layer combination of titanium nitride and a plurality of refractory metal layers thereon, or a multi-layer combination of titanium nitride and a plurality of polycide layers thereon.

Figure 10:
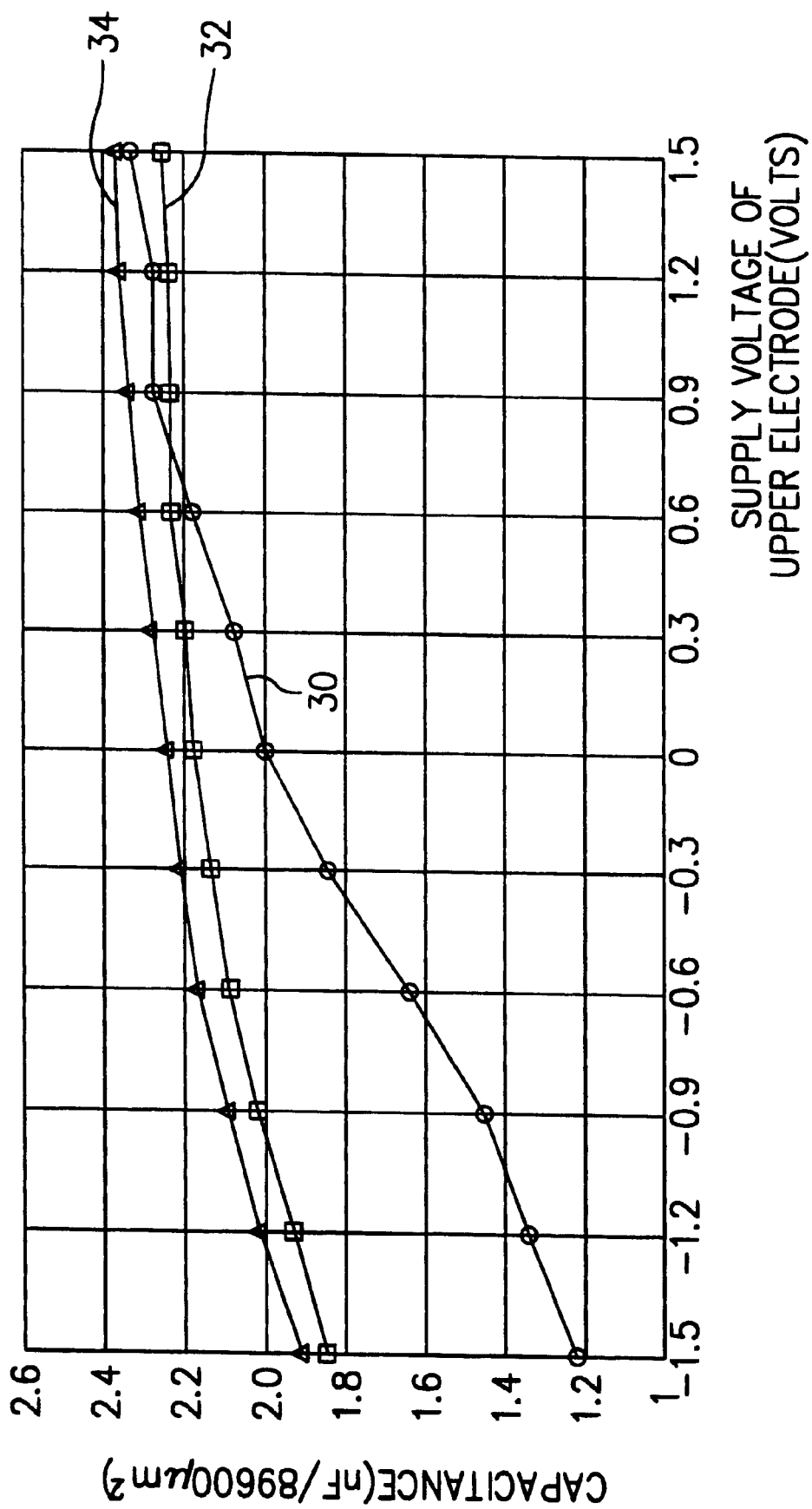
FIGS. 10–12 are graphical illustrations of capacitance response curves for HSG capacitors formed in accordance with various embodiments of the present invention.

Referring now to FIG. 10, graphs of capacitance versus voltage are provided for capacitors formed in accordance with the present invention. Each graph corresponds to a capacitor having a lower electrode surface area of about 89600 $\mu m^2$. Curve 30 corresponds to a capacitor having a silicon nitride diffusion barrier layer 22 which was treated using RTO, and a tantalum oxide dielectric layer 23. Curve 32 corresponds to a CVD-formed SiN diffusion barrier layer 22 without the RTO process. Curve 34 corresponds to another CVD-formed SiN layer 22 followed by an RTO process. Each of the SiN diffusion barrier layers 22 corresponding to curves 32 and 34 had a thickness of about 20 Å. By comparison, the SiN barrier layer 22 corresponding to curve 30 had a thickness of only about 6 Å. The results indicate a significantly more stable Cmin/Cmax ratios (0.94 and 0.92) for the capacitors which have thicker CVD-SiN barrier layers 22 (see, curves 32 and 34) versus the RTN capacitor having a relatively thin barrier layer 22 (see, curve 30) which only had a Cmin/Cmax ratio of 0.75. Curve 34 shows yet a further improvement in overall capacitance where the diffusion barrier layer 22 has been treated with an RTO process.

Figure 12:
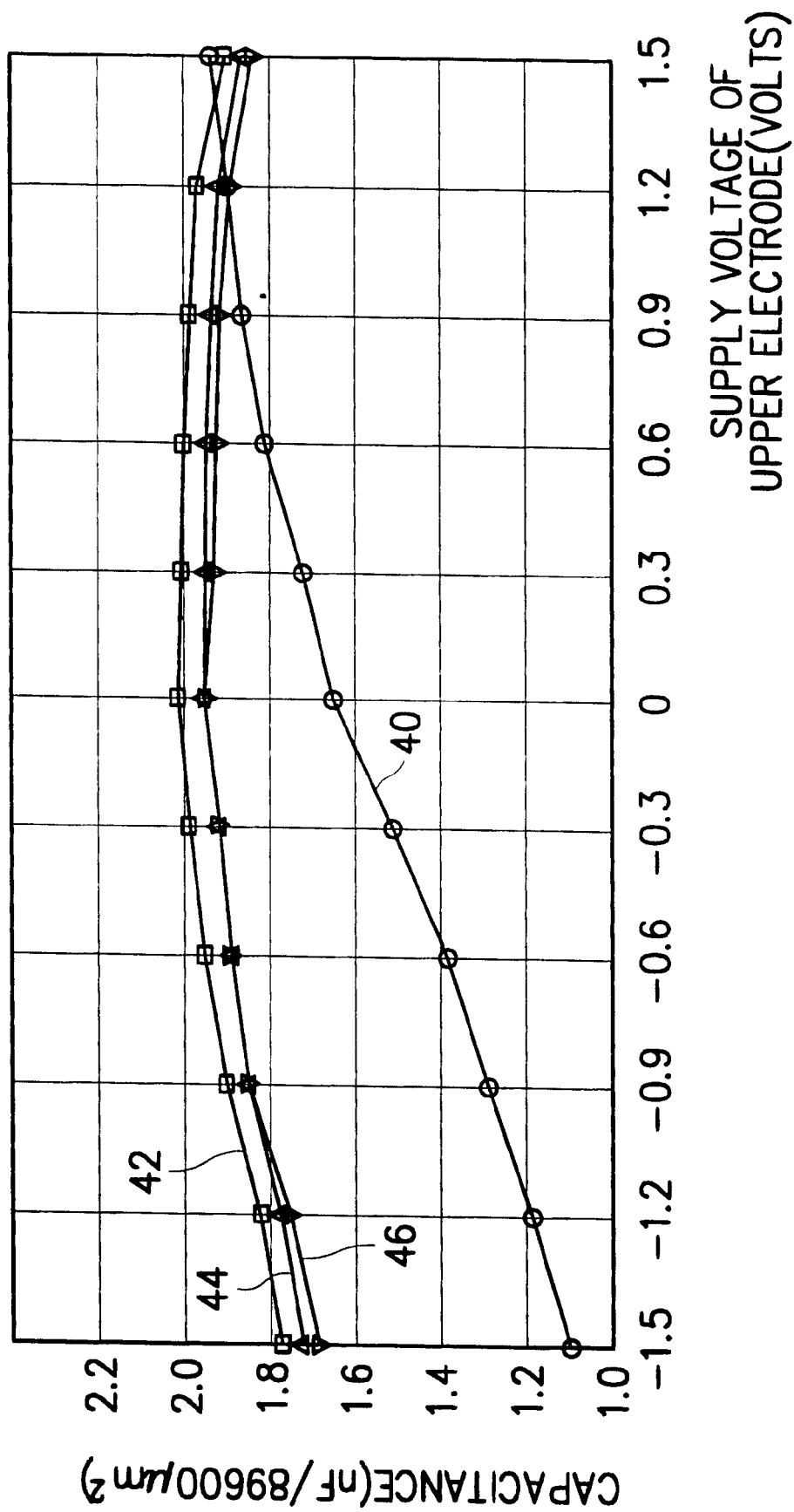

Referring now to FIG. 12, graphs of capacitance versus voltage are provided for capacitors having $Ta_2O_5$ dielectric layers 23. Each graph corresponds to a capacitor having a lower electrode surface area of about 89600 $\mu m^2$. Curve 40 corresponds to a capacitor having an undoped SiN diffusion barrier layer 22 formed using RTN. The RTN process was performed for about 1 minute at a temperature of about 850° C., and the flow rate of $NH_3$ was about 0.9 slm. Curve 42 corresponds to an in-situ phosphorous-doped SiN diffusion barrier layer 22 formed using RTN. The flow rates of the dopant source, $PH_3$, and the reaction source, $NH_3$, were about 450 sccm and 0.9 slm, respectively. Here, the duration of the RTN process was about 1 minute, and the chamber temperature at the wafer level was about 850° C. Curve 44 corresponds to a phosphorous-doped CVD SiN barrier layer 22. The flow rates of $SiH_2Cl_2$, NH3, PH3 were about 30 sccm, 0.9 slm, and 450 sccm, respectively. The temperature of the reaction chamber at the wafer level was about 750° C. Curve 46 corresponds to a capacitor having a composite SiN barrier layer 22, with the first layer formed using RTN and the second layer formed using a CVD process. The first layer (RTN-SiN) was formed in accordance with the above-described process steps for curve 42, and the second layer (CVD-SiN) was formed in accordance with the above-described process steps for curve 44. The results indicate consistently more stable Cmin/Cmax ratios for capacitors including doped diffusion barriers—curves 42, 44 and 46 corresponding to ratios of 0.97, 0.97, and 0.98, respectively. The results further indicate generally greater overall capacitance for the doped barriers (curves 42, 44 and 46). The un-doped RTN response in curve 40 resulted in relatively lower ratio of 0.77.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit capacitor, comprising the steps of:

forming a conductive layer pattern having a first concentration of first conductivity type dopants therein, on a semiconductor substrate;

forming a hemispherical grain (HSG) silicon surface layer on the conductive layer pattern;

doping the HSG silicon surface layer with first conductivity type dopants so that the HSG silicon surface layer has a second concentration of first conductivity type dopants therein which is greater than the first concentration of first conductivity type dopants;

forming a dielectric layer on the doped HSG silicon surface layer; and forming an electrode on the dielectric layer, opposite the HSG silicon surface layer.

2. The method of claim 1, wherein said step of doping the HSG silicon surface layer with first conductivity type dopants comprises exposing the HSG silicon surface layer to a phosphine ($PH_3$) gas.

3. The method of claim 1, wherein said step of forming a HSG silicon surface layer comprises seeding an upper surface of the conductive layer pattern with silicon seed crystals and then growing the seed crystals into single crystal grains.

4. The method of claim 3, wherein the conductive layer pattern comprises a material selected from the group consisting of amorphous silicon and polycrystalline silicon.

5. The method of claim 1, wherein the first concentration of first conductivity type dopants is less than about $1 \times 10^{20}$ $cm^{-3}$ and the second concentration of first conductivity type dopants is greater than about $1 \times 10^{20}$ $cm^{-3}$.

6. The method of claim 3, wherein the conductive layer pattern comprises a first polycrystalline silicon layer in contact with the semiconductor substrate and an amorphous silicon layer on the first polycrystalline silicon layer; and wherein said growing step is followed by the step of annealing the amorphous silicon layer and the single crystal grains.

7. The method of claim 1, wherein said step of forming a HSG silicon layer is preceded by the step of cleaning the conductive layer pattern using a cleaning solution selected from the group consisting of a hydrofluoric acid (HF) solution and a buffered oxide etchant (BOE) solution.

8. The method of claim 1, wherein said step of doping the HSG silicon surface layer comprises exposing the HSG silicon surface layer to a dopant gas containing first conductivity type impurities therein, in a rapid thermal processing (RTP) apparatus.

9. The method of claim 8, wherein said step of exposing the HSG silicon surface layer to a dopant gas in a RTP apparatus includes ramping a temperature of the dopant gas at a first rate to a sustainment temperature in a range between about 550 and 900° C.

10. The method of claim 9, wherein the dopant gas comprises phosphine ($PH_3$); and wherein said ramping step comprises ramping a temperature of the dopant gas upward at a rate in a range between about 1° C. $sec^{-1}$ and 10° C. $sec^{-1}$, to inhibit degradation of the HSG silicon surface layer.

11. The method of claim 10, wherein said ramping step comprises ramping a temperature of the dopant gas at a rate of about 10° C. $sec^{-1}$ to a sustainment temperature of about 800° C.

12. The method of claim 9, wherein said step of exposing the HSG silicon surface layer to a dopant gas in a RTP apparatus includes the steps of ramping a temperature of the dopant gas upward at a first rate to a sustainment temperature in a range between about 550 and 900° C., maintaining the temperature of the dopant gas at the sustainment temperature for a first duration and then ramping the temperature of the dopant gas downward at the first rate.

13. The method of claim 12, wherein said step of exposing the HSG silicon surface layer to a dopant gas in a RTP apparatus comprises exposing the HSG silicon surface layer to the dopant gas while maintaining a pressure in the RTP apparatus at a level in a range between about 5 and 500 torr.

14. The method of claim 13, wherein the dopant gas is provided to the RTP apparatus at a rate in a range between about 200 and 270 sccm.

15. The method of claim 1, wherein said step of doping the HSG silicon surface layer comprises exposing the HSG silicon surface layer to first conductivity type dopants in a low pressure chemical vapor deposition (LPCVD) apparatus.

16. The method of claim 1, wherein said step of doping the HSG silicon surface layer comprises exposing the HSG silicon surface layer to first conductivity type dopants in a low pressure chemical vapor deposition (LPCVD) apparatus, while simultaneously maintaining a pressure and a temperature in the LPCVD apparatus at a level in a range between about 1 and 3 torr and 650 and 850° C., respectively.

17. The method of claim 1, wherein said step of doping the HSG silicon surface layer comprises exposing the HSG silicon surface layer to a plasma containing first conductivity type dopants therein.

18. The method of claim 1, wherein the dielectric layer comprises a nitride-oxide (NO) dielectric layer having a thickness in a range between about 40 and 70 Å.

19. The method of claim 1, wherein said step of doping the HSG silicon surface layer is preceded by the step of cleaning the HSG silicon surface layer with a cleaning solution selected from the group consisting of a hydrofluoric acid (HF) solution and a buffered oxide etchant (BOE) solution.

20. The method of claim 1, wherein said step of forming a dielectric layer is preceded by the step of forming a diffusion barrier layer on the HSG silicon surface layer.

21. The method of claim 20, wherein said step of forming a diffusion barrier layer comprises forming an in-situ doped diffusion barrier layer containing first conductivity type dopants therein, on the HSG silicon surface layer.

22. The method of claim 20, wherein said step of forming a diffusion barrier layer comprises forming an doped or undoped layer of silicon nitride by chemical vapor deposition (CVD).

23. The method of claim 20, wherein said step of forming a HSG silicon surface layer comprises exposing the HSG silicon surface layer to a source gas containing first conductivity type dopants therein.

24. The method of claim 20, wherein said step of forming a dielectric layer comprises forming a layer of tantalum oxide ($Ta_2O_5$) on the diffusion barrier layer.

25. The method of claim 24, wherein said step of forming a diffusion barrier layer comprises forming a silicon nitride layer on the HSG silicon surface layer.

26. The method of claim 25, wherein the silicon nitride layer comprises a first silicon nitride layer formed by rapid thermal nitridation (RTN), on the HSG silicon surface layer, and a second silicon nitride layer formed by chemical vapor deposition (CVD), on the first silicon nitride layer.

27. The method of claim 20, wherein said step of forming an electrode on the dielectric layer is preceded by the step of exposing the dielectric layer to dry oxygen.

28. The method of claim 21, wherein said step of forming a diffusion barrier layer comprises exposing the HSG silicon surface layer to a reactive source gas containing nitrogen and a dopant source gas containing dopant impurities of first conductivity type.

29. The method of claim 21, wherein said step of forming a diffusion barrier layer comprises exposing the HSG silicon surface layer to a first source gas containing silicon, a second source gas containing nitrogen and a dopant source gas containing dopant impurities of first conductivity type.

30. The method of claim 20, wherein said step of forming a diffusion barrier layer comprises forming a first silicon nitride layer by rapid thermal nitridation (RTN), on the HSG silicon surface layer, and then forming a second silicon nitride layer by chemical vapor deposition (CVD), on the first silicon nitride layer.

31. The method of claim 25, wherein said step of forming a layer of tantalum oxide ($Ta_2O_5$) on the diffusion barrier layer comprises the steps of forming a tantalum oxide layer on the diffusion barrier layer and then annealing the tantalum oxide layer in a $N_2O$ ambient.

32. A method of forming an integrated circuit capacitor, comprising the steps of:

forming a conductive layer pattern on a semiconductor substrate;

forming a hemispherical grain (HSG) silicon surface layer having first conductivity type dopants therein, on the conductive layer pattern;

forming a dielectric layer on the HSG silicon surface layer; and forming an electrode on the dielectric layer, opposite the HSG silicon surface layer;

wherein said step of forming a conductive layer pattern comprises forming a conductive layer pattern having a first concentration of first conductivity type dopants in a region therein; wherein said step of forming a HSG silicon surface layer comprises the steps of forming an undoped HSG silicon surface layer on the conductive layer pattern and then doping the HSG silicon surface layer with first conductivity type dopants so that the HSG silicon surface layer has a second concentration of first conductivity type dopants therein which is greater than the first concentration of first conductivity type dopants; and wherein said step of forming a dielectric layer is preceded by the step of forming a diffusion barrier layer on the HSG silicon surface layer.

33. The method of claim 32, wherein said step of forming a diffusion barrier layer comprises forming an in-situ doped diffusion barrier layer containing first conductivity type dopants therein, on the HSG silicon surface layer.

34. The method of claim 32, wherein said step of forming a diffusion barrier layer comprises forming a layer of doped or undoped silicon nitride by chemical vapor deposition (CVD).

35. The method of claim 33, wherein said step of forming a dielectric layer comprises forming a layer of tantalum oxide ($Ta_2O_5$) on the diffusion barrier layer.

36. The method of claim 35, wherein the diffusion barrier layer comprises a first silicon nitride layer formed by rapid thermal nitridation (RTN), on the HSG silicon surface layer, and a second silicon nitride layer formed by chemical vapor deposition (CVD), on the first silicon nitride layer.

37. The method of claim 35, wherein the diffusion barrier layer comprises a silicon nitride layer formed by chemical vapor deposition (CVD).

38. The method of claim 25, wherein said step of forming a layer of tantalum oxide ($Ta_2O_5$) on the diffusion barrier layer comprises the steps of:

forming a first tantalum oxide layer on the diffusion barrier layer;

exposing the first tantalum oxide layer to ultra-violet radiation; then forming a second tantalum oxide layer on the first tantalum oxide layer; and then densifying the second tantalum oxide layer.

39. A method of forming an integrated circuit capacitor, comprising the steps of:

forming an amorphous silicon conductive layer pattern having a first concentration of first conductivity type dopants therein, on a semiconductor substrate;

forming a hemispherical grain (HSG) silicon surface layer, on the amorphous silicon conductive layer pattern;

converting the amorphous silicon conductive layer pattern to polycrystalline silicon; then doping the HSG silicon surface layer with first conductivity type dopants so that a concentration of first conductivity type dopants in the HSG silicon layer is greater than the first concentration;

forming a diffusion barrier layer on the HSG silicon surface layer;

forming a dielectric layer on the diffusion barrier layer, opposite the HSG silicon surface layer; and forming an electrode on the dielectric layer, opposite the diffusion barrier layer.

40. The method of claim 39, wherein said step of forming a diffusion barrier layer comprises forming a silicon nitride layer on the HSG silicon layer; and wherein said step of forming a dielectric layer comprises forming a layer of tantalum oxide on the silicon nitride layer.

41. The method of claim 40, wherein said step of forming a silicon nitride layer comprises forming an in-situ doped silicon nitride layer containing dopants of first conductivity type therein.

42. The method of claim 41, wherein the silicon nitride layer comprises a composite of a first silicon nitride layer formed by rapid thermal nitridation (RTN) and a second nitride layer formed by chemical vapor deposition (CVD).

43. The method of claim 40, wherein the silicon nitride layer comprises a composite of a first silicon nitride layer formed by rapid thermal nitridation (RTN) and a second nitride layer formed by chemical vapor deposition (CVD).

44. The method of claim 43, further comprising the step of densifying the tantalum oxide layer.

45. The method of claim 44, wherein said densifying step comprises exposing the tantalum oxide layer to dry oxygen gas, ultraviolet radiation in an ozone ambient or an $N_2O$ ambient.

46. The method of claim 40, wherein said step of forming a dielectric layer is preceded by the step of performing rapid thermal oxidation (RTO) of the diffusion barrier layer.

* * * * *